United States Patent
Liao et al.

(10) Patent No.: US 8,564,304 B2
(45) Date of Patent: Oct. 22, 2013

(54) INTEGRATED CIRCUIT DEVICE TEST APPARATUS

(75) Inventors: Shyh-Shyan Liao, Taipei (TW); Ying-Che Lo, Hsinchu (TW); Albert C. Sun, Hsinchu (TW)

(73) Assignee: AFA Micro Co., Hsinchu (TW)

( * ) Notice: Subject to any disclaimer, the term of this patent is extended or adjusted under 35 U.S.C. 154(b) by 704 days.

(21) Appl. No.: 12/766,774

(22) Filed: Apr. 23, 2010

(65) Prior Publication Data

US 2011/0260734 A1 Oct. 27, 2011

(51) Int. Cl.
G01R 31/02 (2006.01)
G01R 31/20 (2006.01)
G01R 31/28 (2006.01)
G01R 1/073 (2006.01)
G01R 3/00 (2006.01)
G01R 1/04 (2006.01)

(52) U.S. Cl.
CPC ........ *G01R 31/2805* (2013.01); *G01R 1/07378* (2013.01); *G01R 3/00* (2013.01); *G01R 1/0483* (2013.01)
USPC .......................................................... 324/537

(58) Field of Classification Search
None
See application file for complete search history.

(56) References Cited

U.S. PATENT DOCUMENTS

| | | | | |
|---|---|---|---|---|
| 5,184,068 A | * | 2/1993 | Twigg et al. ............. | 324/756.02 |
| 5,227,717 A | * | 7/1993 | Tsurishima et al. ..... | 324/754.11 |
| 5,631,573 A | * | 5/1997 | Ohno ........................ | 324/754.07 |
| 5,920,192 A | * | 7/1999 | Kiyokawa .................. | 324/750.2 |
| 6,445,203 B1 | * | 9/2002 | Yamashita et al. ........ | 324/750.08 |
| 6,573,739 B1 | * | 6/2003 | Saito ......................... | 324/750.25 |
| 7,108,535 B1 | | 9/2006 | Mingviriya | |
| 7,472,321 B2 | | 12/2008 | Chun | |
| 7,478,290 B2 | | 1/2009 | Co et al. | |
| 7,581,962 B2 | | 9/2009 | Henry et al. | |
| 7,633,304 B2 | | 12/2009 | Schaule et al. | |
| 2001/0012725 A1 | | 8/2001 | Maeda et al. | |
| 2008/0262773 A1 | | 10/2008 | Howell | |
| 2011/0156734 A1 | * | 6/2011 | Berry et al. .............. | 324/750.19 |

OTHER PUBLICATIONS

Chowdhury, Sazzadur et al., "A MEMS Socket System for High Density SOC Interconnection," IEEE International Symposium on Circuits and Systems, May 26-29, 2002. vol. 1 pp. I-657-I-660.

* cited by examiner

*Primary Examiner* — Paresh Patel
(74) *Attorney, Agent, or Firm* — Haynes Beffel & Wolfeld LLP

(57) ABSTRACT

A carrier and a frame, movable relative to one another in both an x-y direction and a z direction provide a test bed for MEMS like integrated circuits. The carrier includes receptacles mounted on a test substrate. The frame includes pins projecting from a surface of a plate. The plate has open areas. In a test sequence, the frame and carrier are oriented so that the cavities are exposed by open areas of the plate; a tool is used to place a device to be tested in each cavity; the frame and carrier are moved into alignment and toward one another to bring the pin ends into contact with the devices in the cavities. Then a test cycle is carried out. Following the test cycle the process is reversed to expose the devices for a pick-and-place tool to remove and bin the tested devices.

18 Claims, 20 Drawing Sheets

INTEGRATED CIRCUIT DEVICE TEST APPARATUS

BACKGROUND

This invention relates to integrated circuit device testing and, in particular embodiments, to testing MEMS devices having inertial (motion, acceleration, position) sensing capabilities.

Conventional IC test devices include a socket body and a lid. The socket body has a cavity or nest in which a device to be tested can placed for testing. The lid has a pressure block that urges the device against test connectors at the bottom of the cavity when the lid is engaged with the socket body. In a so-called "clamshell" configuration, the lid is hinged to the block. Clamps or clips may be employed to lock (engage) the lid with the block. A test procedure using such a conventional test socket entails many steps, some of them mechanically complex: a pick-and-place tool picks up an IC device and places it into the nest. The lid is placed over the socket body. The lid is engaged (locked) to the body. A testing cycle is carried out. The lid is disengaged (released) from the socket body. The lid is removed from the body. The pick-and-place tool removes the tested device from the cavity and sorts it according to whether it successfully qualified during the test cycle.

Testing inertial sensing capabilities of a MEMS device, for example, requires that the MEMS device be movable during the testing cycle. Test apparatus for such devices must accordingly be capable of being moved (tilted, shaken, rotated) while the device being tested is secured in the apparatus.

Costs associated with testing can constitute a considerable proportion (half or more, in some cases) of the cost of manufacture of qualified integrated circuit devices, and improving throughput in device testing sequences can significantly decrease testing costs.

SUMMARY

In general the invention features apparatus for testing integrated circuit devices. The apparatus includes a carrier and a frame. The carrier includes receptacles mounted on a generally planar test substrate, and each receptacle includes one or more cavities into which devices to be tested can be received. The cavities may be blind, that is, they each may have a floor including test contacts upon which the device rests; or the cavities may pass through the receptacles, so that the devices rest upon test contacts on the test substrate itself. The frame includes pins mounted to and projecting from a surface of a generally planar plate, and the plate has open areas, formed at the plate margin or as openings through the plate. To ready the apparatus for deployment in a test sequence, the frame and carrier are oriented so that the planes of the substrate and the plate are generally parallel and so that the pins project toward the substrate. The frame and carrier can be moved (displaced or rotated) relative to one another in an x-y plane (parallel to the substrate, for example); and they can be moved relative to one another in a z direction (perpendicular to the x-y plane). When ready for deployment the frame and carrier are situated far enough apart in the z direction so that when they are displaced relative to one another in an x-y direction the pins do not impinge on the receptacles (a "shift position").

The carrier and the frame to be deployed with it are complementary. That is, the arrangement of the pins on the plate is complementary to the arrangement of cavities on the carrier; when the complementary frame and carrier are oriented for deployment they can be moved relative to one another in an x-y direction to a "pin alignment" position where the ends of the pins are aligned with corresponding cavities. And, the arrangement of the open areas of the plate is also complementary to the arrangement of cavities on the carrier; that is, when the complementary frame and carrier are oriented for deployment they can be moved relative to one another in an x-y plane to a position where the cavities are exposed for placement or removal of devices to be tested. In other words, when ready for deployment the frame and carrier can be shifted alternately to a "pin alignment" position, and to a position in which the cavities are exposed.

Test circuitry in the test substrate may be employed in a conventional manner through a test cycle. Machinery (which may be automated) coupled to the apparatus (frame and carrier) orients and manipulates the frame and the carrier through various stages of the test sequence. Where the device to be tested includes an inertial sensor functionality, machinery (which may be automated, and which may constitute the machinery to manipulate the frame and carrier) may be coupled to the apparatus in a test stage, to rotate, shake, tilt, or otherwise move the apparatus during the test cycle. In such systems the frame may be shifted in relation to the carrier, to place and secure devices to be tested and to remove the devices following test cycle; and the entire apparatus (with devices secured in the test cavities) can be rotated, shaken, tiled or otherwise moved during a test cycle, to test the inertial sensing capabilities of the devices.

In a test sequence, the frame and carrier are made ready for deployment as described generally above; the frame and carrier are oriented relative to one another in a position in which the cavities are exposed by open areas of the plate; a tool such as a pick-and-place tool is used to place a device to be tested in each cavity; the frame and carrier are moved relative to one another in an x-y direction to a "pin alignment" position; the frame and carrier are moved toward one another to bring the pin ends into contact with the devices in the corresponding cavities (a "test position"); a test cycle of one or more functionalities of the devices is carried out; following completion of the test cycle the frame and carrier are moved away from one another to a "shift position"; the frame and carrier are moved relative to one another in an x-y direction to a position in which the devices in the cavities are exposed by open areas of the plate; and a tool such as a pick-and-place tool is used to remove and bin the tested devices.

In one general aspect the invention features IC device testing apparatus including a frame and a carrier configured to be movable relative one another in an x-y plane and in a z direction; the carrier including receptacles mounted on a test substrate, each receptacle including one or more cavities into which devices to be tested can be received; the frame including pins mounted to and projecting from a surface of a plate, and the plate having open areas; wherein the pins are arranged in a manner complementary to the arrangement of the cavities, and the open areas are arranged in a manner complementary to the arrangement of the cavities.

In some embodiments each receptacle includes one cavity; in some embodiments each receptacle includes two or more (for example, four) cavities. In some embodiments the cavities are blind, so that devices placed in the cavities rest on test contacts in a cavity floor; in some embodiments the cavities pass through the receptacles, so that the devices rest upon test contacts on the test substrate itself.

In some embodiments the open areas are formed as openings through the plate; in some embodiments the open areas are formed at the plate margin; in some embodiments the open areas include both openings through the plate and open areas at the plate margin.

In some embodiments the frame and carrier are configured to be moveable relative to one another in an x-y plane along a straight trajectory; in some embodiments the frame and carrier are configured to be moveable relative to one another in an x-y plane along a curved trajectory; in some embodiments the frame and carrier are configured to be moveable relative to one another in an x-y plane along a circular trajectory; in some embodiments the frame and carrier are configured to be rotatable relative to one another in an x-y plane about a common center.

In a procedure using the apparatus to test MEMS inertial sensing devices, a sequence of steps can include first orienting the frame and carrier so that the open areas of the plate expose a plurality of cavities on the carrier. Then, a batch of devices to be tested is loaded in the exposed cavities. The frame is moved (rotated or displaced) relative to the carrier to align the pins with the cavities. The frame is moved toward the carrier (for example, the frame is lowered) to secure the devices within the cavities, and provide electrical contact of the devices to a test processor. A test program is initiated. At an appropriate time in the test program, the frame and carrier are moved as a unit to perturb sensors on the devices under test. The test program analyzes signals produced by the devices under test. After the testing, the carrier is raised and moved to expose the cavities on the carrier. The tested devices are removed from the apparatus and binned, and a new batch of devices to be tested can be loaded in the apparatus for a next test sequence.

IC devices to be tested include, for example integrated circuit chips; assemblies and packages including one or more IC chips; and assemblies including one or more packages and one or more chips. The various components of the device to be tested may have any of a variety of functionalities, including sensing, processing, memory. In particular, the device to be tested may include one or more MEMS components; and the device to be tested may include an inertial sensing functionality.

The test apparatus in various embodiments has a simple structure, and is easy to maintain. It can be constructed and employed at low cost. It is readily adaptable to interface with conventional equipment (for example, pick-and-place tool; control and data processing for functionality test and, where desired, burn-in and/or programming). The apparatus provides for high-density batch processing, and the test sequence has a reduced number of stages, so that it can operate with high throughput.

BRIEF DESCRIPTION OF THE DRAWINGS

FIG. 1A is in a plan view, and FIG. 1B is in a sectional view.

FIG. 2A is in a plan view, and FIG. 2B is in an elevational view.

FIGS. 3A, 3C, 4A, 7A and 8A are in plan views; and FIGS. 3B, 3D, 4B, 5, 6, 7B and 8B are in partly elevational and partly sectional views.

FIGS. 8A, 8B are diagrammatic sketches showing stages alternative to the stage shown in FIGS. 7A, 7B. FIG. 8A is in a plan view; and FIG. 8B is partly in an elevational and partly in a sectional view.

FIG. 16A is in a plan view, and FIG. 16B is in a sectional view.

FIG. 17A is in a plan view, and FIG. 17B is in an elevational view.

FIGS. 18A and 19A are in plan views; and FIGS. 18B and 19B are in partly elevational and partly sectional views.

FIG. 21A is in a plan view; FIG. 21B is in a sectional view; and FIG. 21C is in an elevational view.

FIG. 22A is in a plan view; FIG. 22B is in an elevational view.

FIGS. 23A and 24A are in plan views; FIGS. 21B and 24B are in sectional views; and FIGS. 23B and 24C are in elevational views.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, features corresponding to features shown in other drawings are not all particularly renumbered, although they are all readily identifiable in all the FIGs. Also for clarity of presentation certain features are not shown in the FIGs., where not necessary for an understanding of the invention.

Figure 1A:
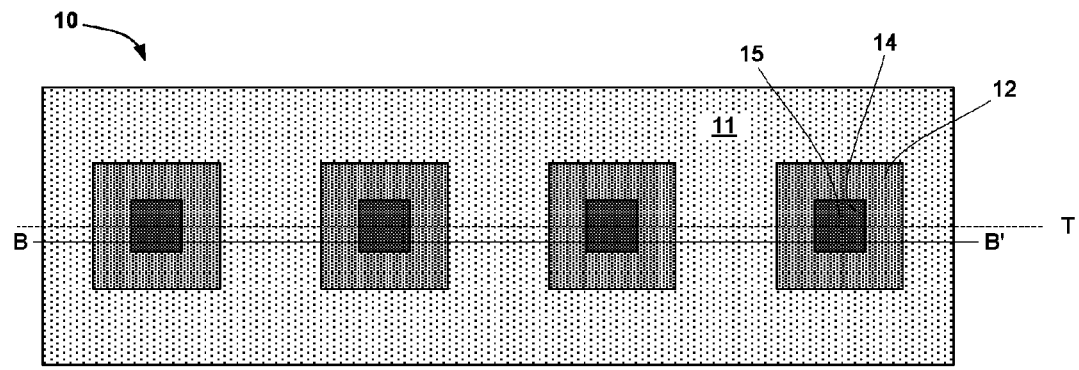
FIGS. 1A and 1B are diagrammatic sketches showing an IC test carrier according to an embodiment.
Figure 1B:
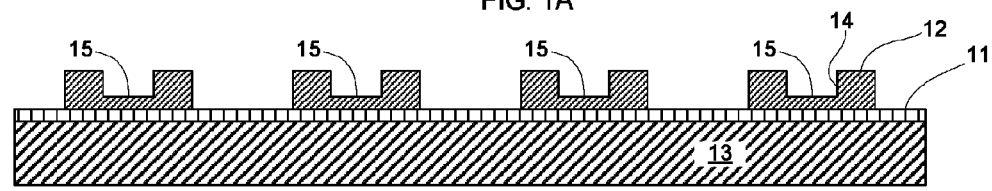

The IC test manipulator includes a carrier, on which test receptacles are mounted, and a frame which is configured for use with the carrier. The carrier and frame are FIGS. 1A, 1B illustrate an example of a carrier 10. The carrier 10 in this example includes a substrate 11 mounted on a support 13. The substrate 11 includes test circuitry, and devices associated therewith (not shown) mounted on an upper surface thereof. Receptacles 12 are mounted in an array (in this example, a row) on the surface of the circuit board 11. Each receptacle in this example is provided with a cavity 14 configured and dimensioned to receive a device to be tested, and in this example the floors 15 of the cavities lie generally within a plane (an "x-y plane") parallel to the plane of the upper surface of the substrate. And, in this example, the receptacles (and the cavities) are centered on a line (indicated by broken line T in FIG. 1A).

Figure 2A:
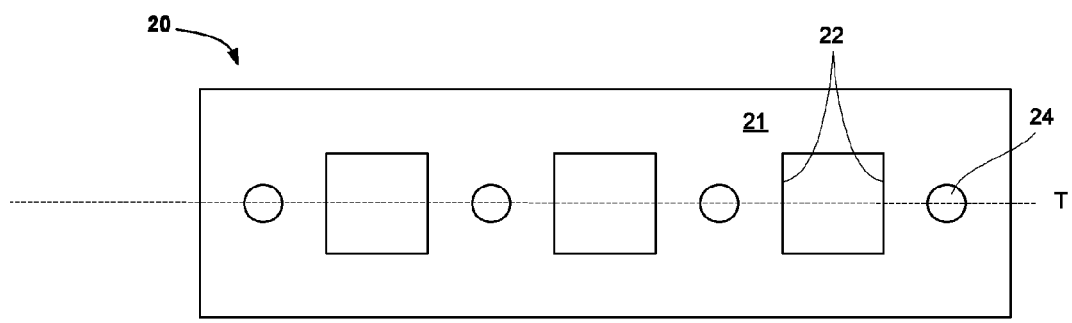
FIGS. 2A and 2B are diagrammatic sketches showing an IC test frame suitable for deployment together with a test carrier as shown in FIGS. 1A and 1B according to an embodiment.
Figure 2B:
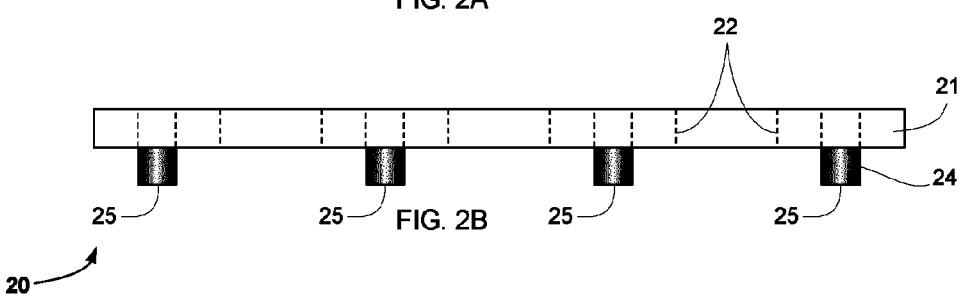

FIGS. 2A, 2B illustrate an example of a frame 20, configured for use with a carrier configured and dimensioned as in FIGS. 1A, 1B. The frame 20 includes a plate 21 having pins 24 projecting in an array (in this example, a row) from a lower surface thereof; and openings 22 through the plate 21. The openings 22 define inner margins of the plate, and outer margins of the plate include a margin 26 at the end of the plate. In this example the lower ends 25 of the pins lie generally within a plane (an "x-y plane") parallel to the plane of the lower surface of the plate. And, in this example, the lower ends of the pins are centered on a line (indicated by broken line T in FIG. 2A).

The plate may be constructed of any material having sufficient rigidity to provide satisfactorily uniform electrical contact between the devices and the floor of the cavities. Metals and metal alloys, for example, and rigid organic polymers, may be suitable.

The pins may take any of a variety of forms and may be made of any of a variety of materials. In some examples, the pins are threaded bolts of an organic polymer material (such as nylon, for example), and they are mounted in the plate by turning them into or through threaded holes in the plate. In other examples, the pins are springs or are spring-loaded to provide shock-relief at the point of contact with the devices.

Figure 3A:
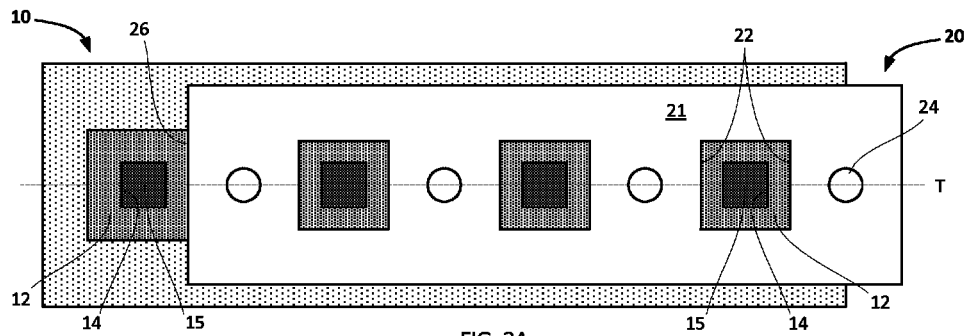
FIGS. 3A, 3B; 3C, 3D; 4A, 4B; 5; 6; and 7A, 7B are diagrammatic sketches showing stages in deployment of an IC test manipulator including a carrier as shown in FIGS. 1A and 1B and a frame as shown in FIGS. 2A and 2B.
Figure 3B:
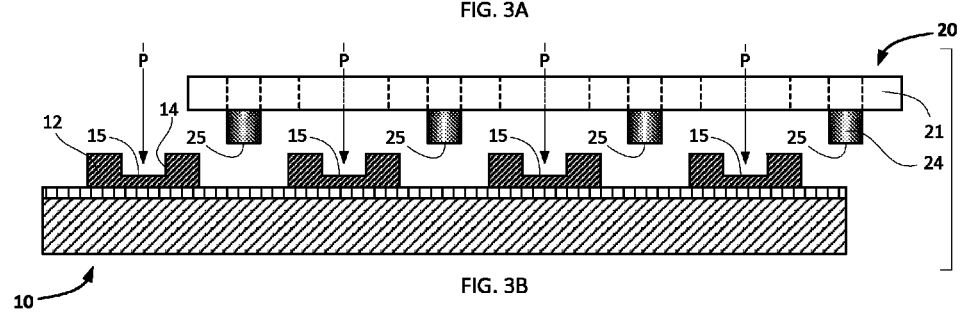

FIGS. 3A, 3B illustrate a stage in deployment of a frame 20 as in FIGS. 2A, 2B with a carrier 10 as in FIGS. 1A, 1B. At this stage the frame is positioned over the carrier, with the plane of the lower ends of the pins parallel to the plane of the floors of the cavities, and the center line of the pin ends is aligned over the center line of the cavities (as indicated by the single broken line T in FIG. 3A). The stage illustrated here may be referred to as a "load" stage, in which the cavities 14 are not obscured by the frame; the cavities are exposed, for example through the openings 22 in the plate 21 and beyond the outer margin 26 of the plate 21. In this "load" stage, devices to be tested can be placed, as suggested by the arrows P in FIG. 3A, in the exposed cavities. Typically, the devices are placed using automated equipment (not shown in the FIGs.), such as a conventional "pick-and-place" tool. Accordingly, the openings 22 in the plate and the margin 26 of the plate are shaped and dimensioned to accommodate the device and the tool during placement.

Figure 3C:
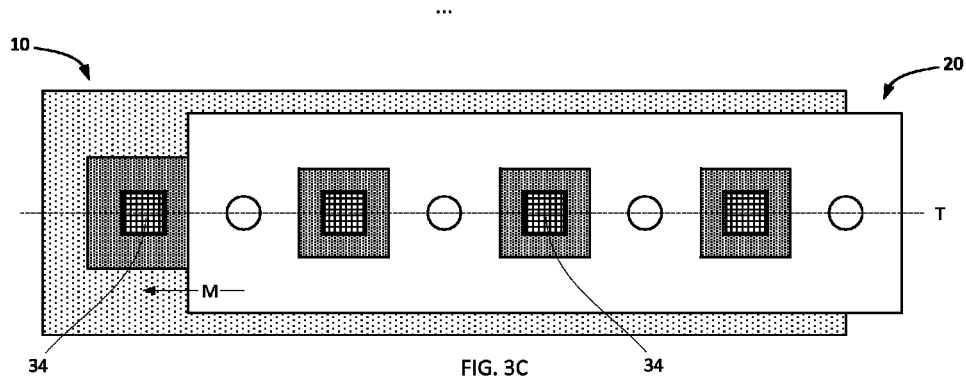
Figure 3D:
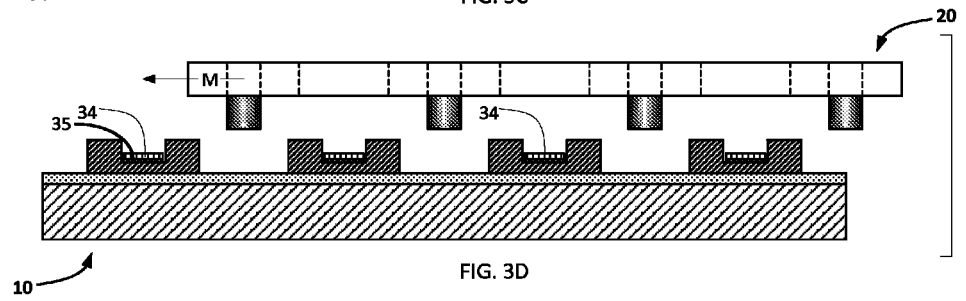

FIGS. 3C, 3D illustrate a further stage in deployment of the frame 20 with the carrier 10. At this stage the devices 34 have been placed in the cavities, and the placement tool (not shown in the FIGs.) has been withdrawn. The stage illustrated here may be referred to as a "shift" stage, in which the frame 20 is moved in relation to the carrier in an x-y direction parallel to the center line of the pin ends, as suggested by the arrow M. Relative movement in the x-y direction continues until the pin ends 25 are vertically aligned above the devices 34 in the respective cavities 14, and then the x-y movement M is stopped, as illustrated in FIGS. 4A, 4B.

Figure 4A:
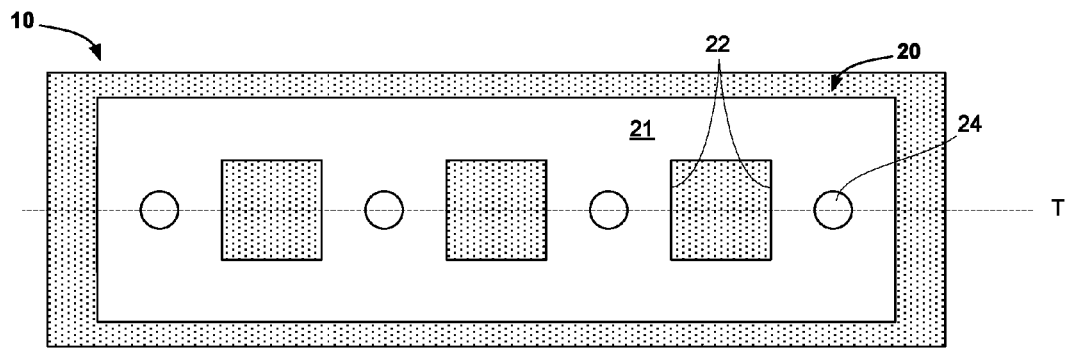
Figure 4B:
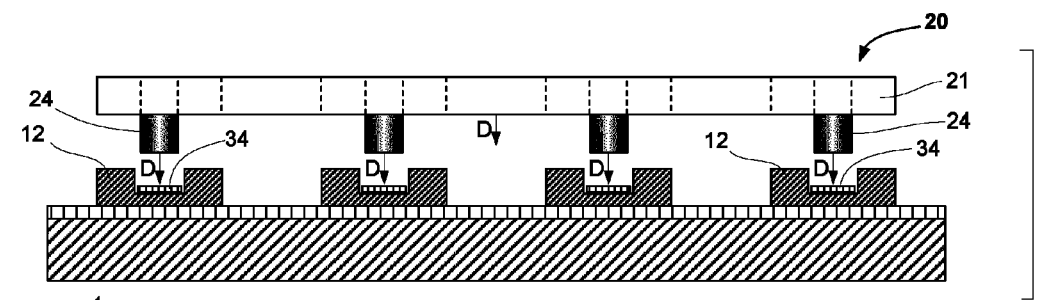
Figure 5:
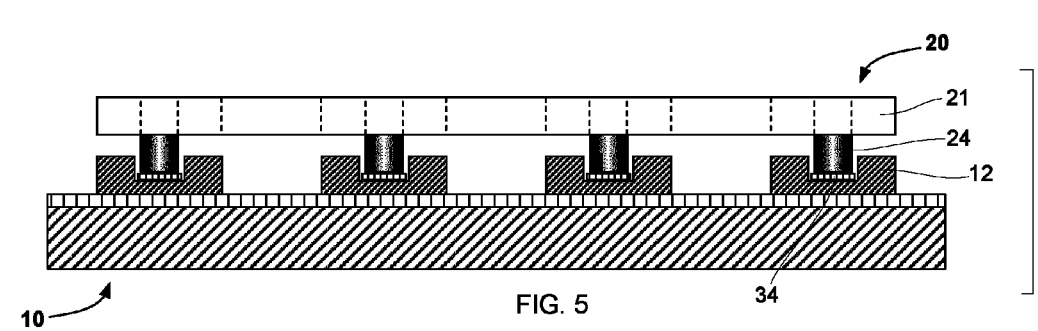

The stage illustrated in FIGS. 4A, 4B may be referred to as a "compression" stage, in which the frame is moved vertically downward in relation to the carrier (that is, in a z direction), as suggested by the arrows D. The downward movement of the frame brings the pins 24 downward into the cavities, and eventually brings the pin ends 25 in contact with the devices 34, as illustrated in FIG. 5. The downward movement continues until the pins compress the devices against the floors of the cavities with a force sufficient to establish a secure (temporary) electrical continuity between the devices and electrical contacts in the cavities, but not so great as to damage the devices. The force may be provided by the weight of the frame; or, the mechanism that moves the frame may be controlled to provide a suitable degree of force.

Figure 27:
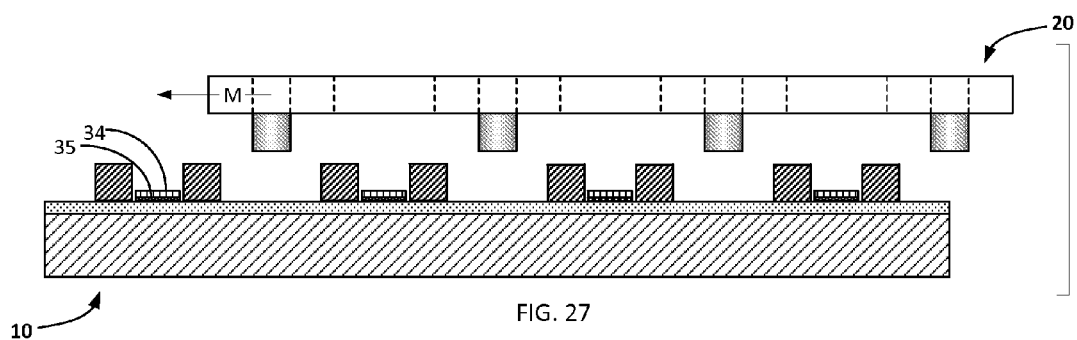
FIG. 27 is an illustration of one of the stages in deployment of an IC test manipulator in an alternative cavity and receptacle configuration.

In the example shown in FIG. 3D, the cavity is illustrated as a blind cavity in the receptacle; that is, the cavity does not pass through the receptacle. In such a configuration, the test contacts 35 in the floor of the cavity are rerouted to contacts at the underside of the receptacle, to make contact with the test circuitry on the underlying substrate and thereby to provide electrical continuity between the device and the test circuitry. In other embodiments, as is shown in FIG. 27, the cavity passes completely through the receptacle, and the device is placed in the cavity directly on the underlying substrate; in such embodiments the area of the test circuitry that is exposed at the bottom of the cavity constitutes the "floor" of the cavity, and the device makes electrical contact at test contacts 35 to the test circuitry on the underlying substrate.

The stage illustrated in FIG. 5, in which the devices are clamped in place in the cavities, may be referred to as a "test" stage. In this stage, the test circuitry is employed to test the functionality of the devices (or at least of selected components of the devices). The results of the test are recorded for the devices. The device may be a bare IC chip; or, it may be a package or assembly including one or more IC chips, and the chips may have more than one functionality. For instance, a MEMS inertial sensor may be mounted in a package or assembly together with a chip having processing and/or memory functionality, such as an ASIC. Where the device is or includes position or motion or acceleration (inertial) sensing functionality, this functionality may be tested by shaking or tilting or rotating or otherwise moving the assembly. Other functionality in the device may be tested during the "test" stage, either sequentially or concurrently with testing the inertial functionality. Or, other functionality may be tested in a separate test sequence (for example, following a "binning" procedure), using the same or different test apparatus.

As may be appreciated, other procedures than functionality testing may be conducted during the "test" stage. For example, a "programming" procedure, or a "burn-in" procedure may be carried out on the device in addition to functionality testing.

Figure 6:
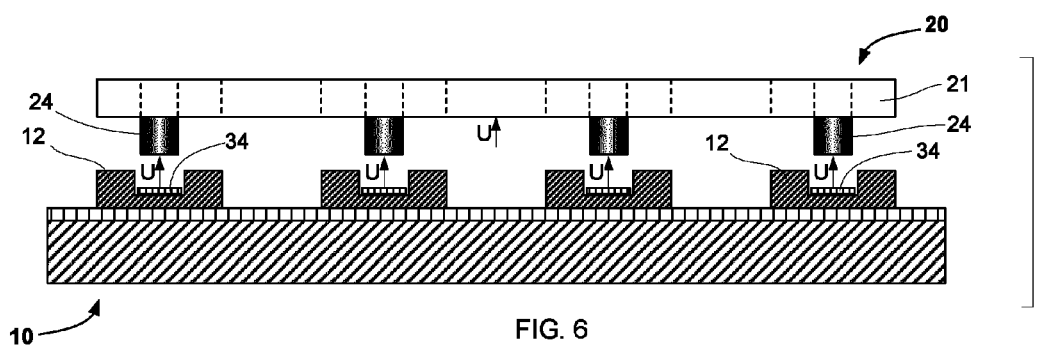

Following completion of the testing the frame is moved upward in relation to the carrier (that is in a z direction, opposite the z direction of the "compression" stage), as suggested by the arrows U in FIG. 6. The upward movement of the frame brings the pins 24 upward away from the devices 34 in the floors of the cavities 12, and the stage illustrated here may be referred to as a "decompression" stage.

Eventually the upward movement of the frame brings the pin ends 25 to a level above the receptacles, so that the frame and pins can again be moved in an x-y direction without interference between the pins and the receptacles. There follows a second "shift" stage, in which the frame 20 is again moved in relation to the carrier 10 in an x-y direction parallel to the center line of the pin ends. Relative movement in the x-y direction continues until the devices 34 in the cavities 14 are exposed, and then the x-y movement is stopped. Completion of the second shift stage is shown in two variants in FIGS. 7A, 7B, and in FIGS. 8A, 8B. The direction of movement in the second shift stage may be opposite the direction in the first shift stage, as suggested by the arrow M' in FIGS. 7A, 7B; the devices 34 are again exposed (refer to FIGS. 3C, 3D), for example through the openings 22 in the plate 21 and beyond the outer margin 26 of the plate 21. Or, where the outer margin of the plate is suitably configured, the direction of movement in the second shift stage may be a continuation of the direction in the first shift stage, as suggested by the arrow M" in FIGS. 8A, 8B; the devices 34 are here exposed for example through the openings 22 in the plate 21 and beyond the outer margin 28 at the end of the plate 21 opposite the outer margin 26.

Figure 7A:
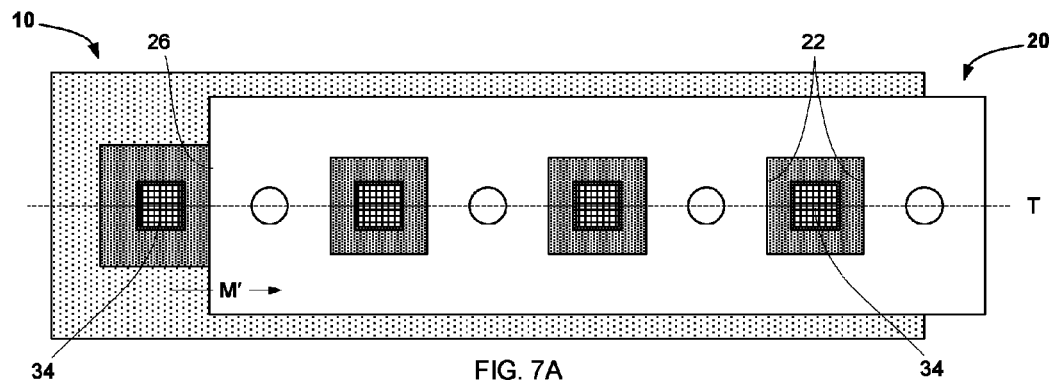
Figure 7B:
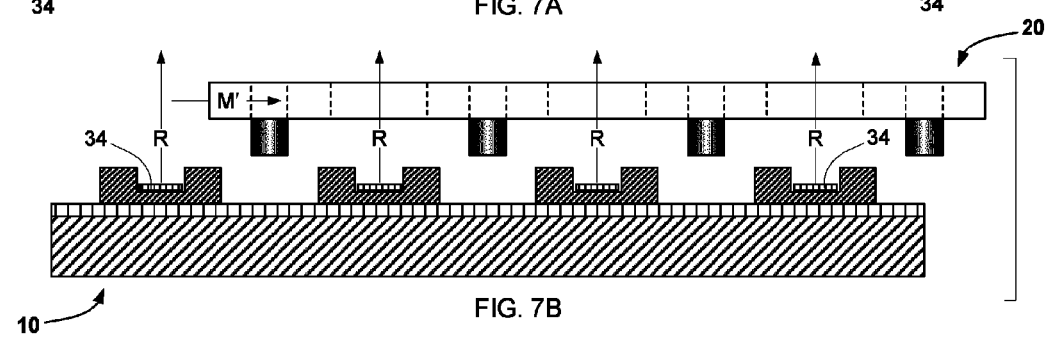
Figure 8A:
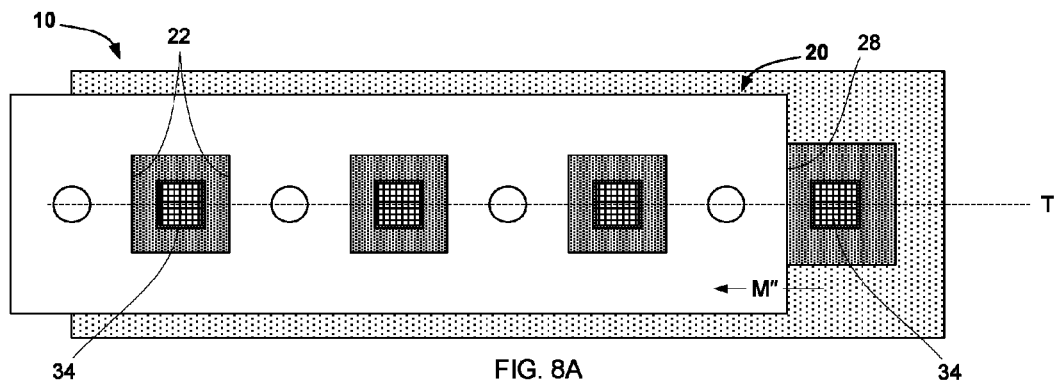
Figure 8B:
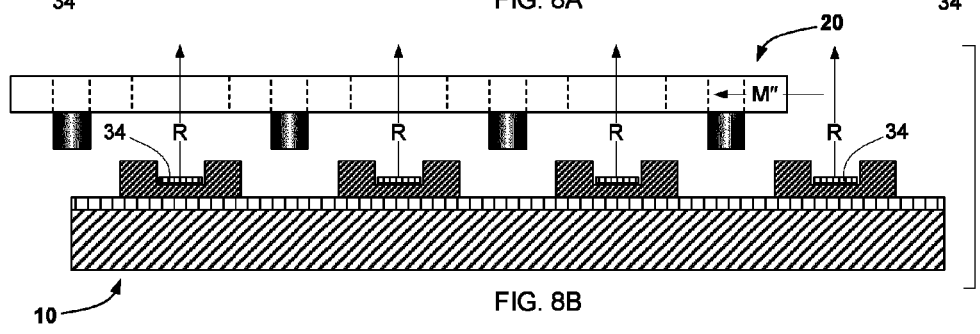

The completion of the second "shift" stage as shown in two examples in FIGS. 7A, 7B, and in FIGS. 8A, 8B, may be referred to as a "removal" stage, as the exposed devices 34 are now available for removal from the cavities, as suggested by the arrows R in FIGS. 7B and 8B. Typically, the devices are removed using automated equipment (not shown in the FIGs.), such as a conventional "pick-and-place" tool; and the tool may be the same tool as used in the "load" stage. Accordingly, the openings 22 in the plate and the margin 26 of the plate are shaped and dimensioned to accommodate the device and the tool during placement.

Removal of the devices proceeds by a "binning" process: devices that failed the test criteria during the test stage are separated by the removal tool from devices that satisfied the test specifications; and the devices that passed the test are sent along for further processing.

Once the tested devices have been removed from the cavities, the apparatus is again ready to receive untested devices for testing, and a new testing sequence may be carried out, starting with a "load" stage.

When the frame and the carrier are ready for deployment, the surfaces of the plate and of the substrate are generally parallel to one another; particularly, as noted above, the pin ends lie in a plane generally parallel to the plane of the plate, and the cavity floors lie in a plane generally parallel to (or coincident with) the plane of the substrate. Generally herein, a movement of the frame or the carrier in an x-y direction means a relative movement (displacement or, as described with reference to FIGS. 21A through 24C below, rotation) in any of these planes. And generally herein, a movement of the frame or the carrier in a z direction means a relative movement in a direction perpendicular to any of these planes. In the drawings the frame is illustrated as being above the carrier and, accordingly, the pins are shown projecting downward toward the carrier and the cavities are shown opening upward toward the frame; and movement in the z direction may be an upward or downward movement of the frame relative to the carrier.

During the test stage, the pins rest upon the devices in the cavities to firmly hold the devices against the test contacts, and the frame may be said to be in a "test position". During the shift stages the frame is held some distance away from the carrier, so that the pins do not interfere with the receptacles during movement of the frame in an x-y direction, and the frame may be said to be in a :shift position".

Typically, the carrier and the frame will be held, positioned, and moved using automated machinery (not shown in the FIGs.). As may be appreciated, relative movement of the frame and the carrier may be accomplished by holding the carrier immobile and moving the frame, or by holding the frame immobile and moving the carrier, or by moving both the frame and the carrier. Where testing of motion or position or acceleration functionality is required, the entire assembly (carrier and frame in a test position) may be moved or tilted using the automated machinery as the electronic testing is carried out.

As will be appreciated, a greater number of devices may be processed through a testing sequence by mounting a greater number of receptacles, accommodating a greater number of devices, on the carrier. For instance, the carrier in a configuration similar to that shown in FIGS. 1A, 1B may have a greater number of receptacles in the row, and the corresponding frame (similar to that shown in FIGS. 2A, 2B) may have a correspondingly greater number of openings, arranged at suitable intervals in the row.

Figure 9:
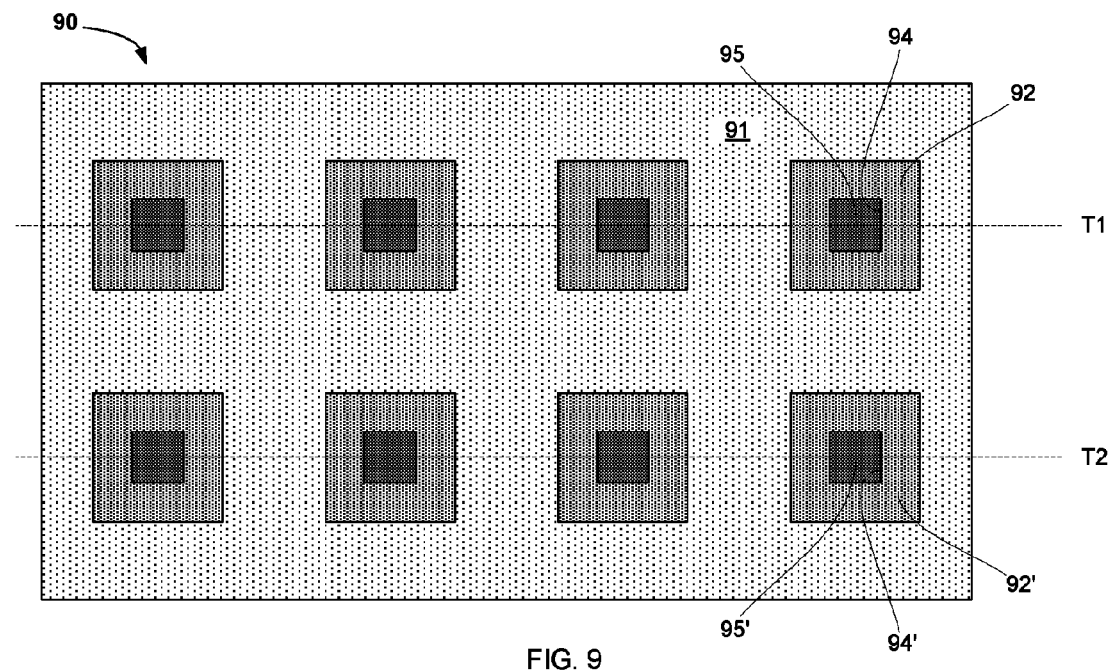
FIG. 9 is a diagrammatic sketch in plan view showing an IC test carrier according to another embodiment.
Figure 10A:
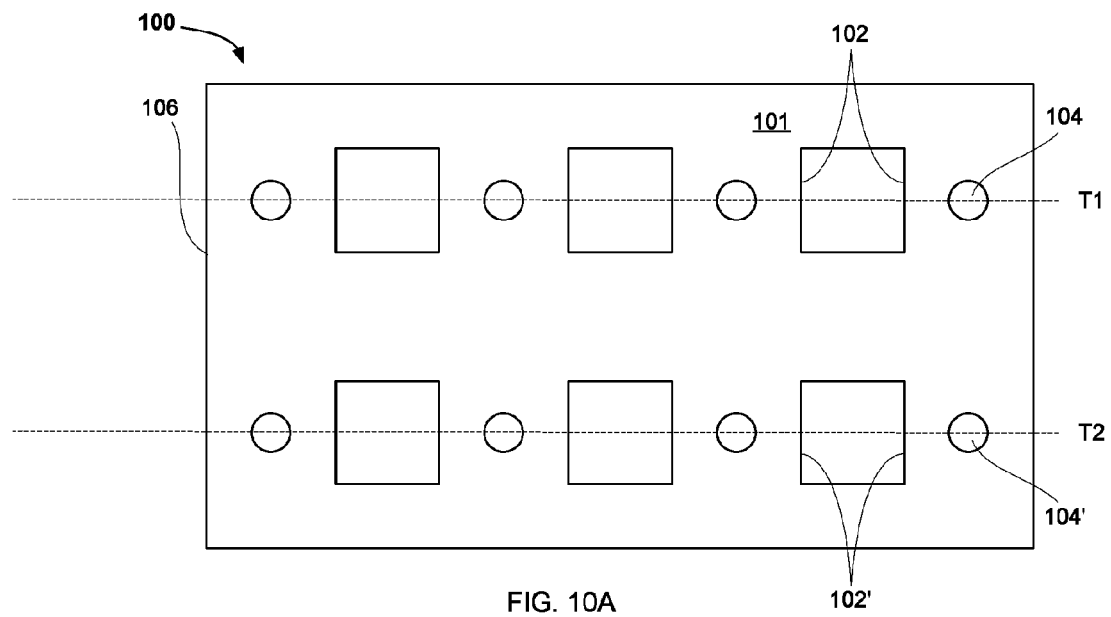
FIG. 10A is a diagrammatic sketch in plan view showing an IC test frame suitable for deployment together with a test carrier as shown in FIG. 9 according to another embodiment.

Or, for instance, the receptacles may be mounted in an array having more than one row, and the corresponding frame may have a correspondingly greater number of openings, in a suitably corresponding array. An example of apparatus having the receptacles and the openings arrayed in two rows is illustrated in FIGS. 9, 10A. FIG. 9 shows in plan view a carrier 90 having an orthogonal array of receptacles 92, 92' mounted in two rows on a substrate 91, which includes test circuitry and devices associated therewith (not shown in the FIGs.), mounted on an upper surface thereof. Each receptacle in this example is provided with a cavity 94, 94' configured and dimensioned to receive a device to be tested, and in this example the floors 95, 95' of the cavities lie generally within a plane (an "x-y plane") parallel to the plane of the upper surface of the substrate. And, in this example, the rows of receptacles (and the cavities) are centered on two rows, indicated by broken lines T1 and T2, in FIG. 9.

FIG. 10A illustrates an example of a frame 100, configured for use with a carrier configured and dimensioned as in FIG. 9. The frame 100 includes a plate 101 having pins 104, 104' projecting in an array of two rows from a lower surface thereof; and openings 102, 102' through the plate 101. The openings 102, 102' define inner margins of the plate, and outer margins of the plate include a margin 106 at the end of the plate. In this example the lower ends (not visible in the FIG.) of the pins are centered on a line (indicated by broken lines T1 and T2 in FIG. 10A).

Figure 11A:
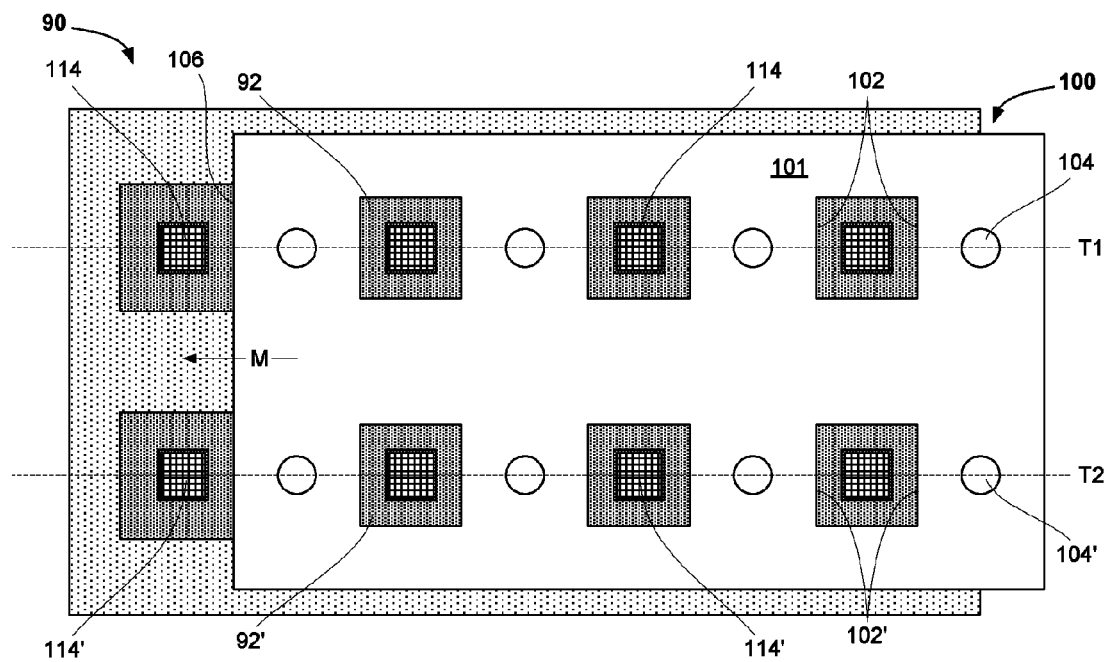
FIGS. 11A and 12 are diagrammatic sketches in plan views showing stages in deployment of an IC test manipulator including a carrier as shown in FIG. 9 and a frame as shown in FIG. 10A.
Figure 12:
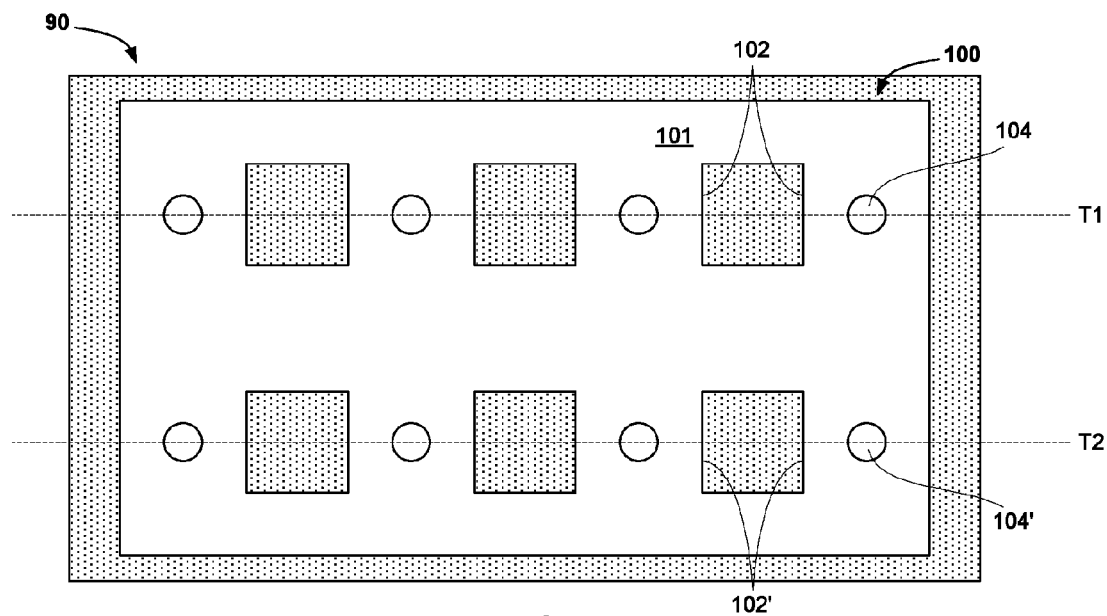

FIGS. 11A and 12 illustrate stages in deployment of a carrier and frame as in FIGS. 9, 10A in a device testing sequence. FIG. 11A illustrates the completion of a "load" stage and initiation of a first "shift" stage. Here, the devices 114, 114' to be tested were earlier loaded into the cavities in the array of receptacles 92, 92' by accessing them through the openings 102, 102' and beyond the outer margin 106 of the plate 101. During the first "shift" stage the frame 100 is moved in relation to the carrier 90 in an x-y direction parallel to the center lines of the rows of pins, as suggested by the arrow M. Relative movement in the x-y direction continues until the ends of the pins 104, 104' are vertically aligned above the devices 114, 114' in the respective cavities, and then the x-y movement M is stopped, with a result as appears in plan view in FIG. 12. FIG. 12 illustrates in plan view the completion of the first "shift" stage; in plan view the apparatus appears as in FIG. 12 through the "test" stage and on to initiation of the second "shift" stage.

Figure 13:
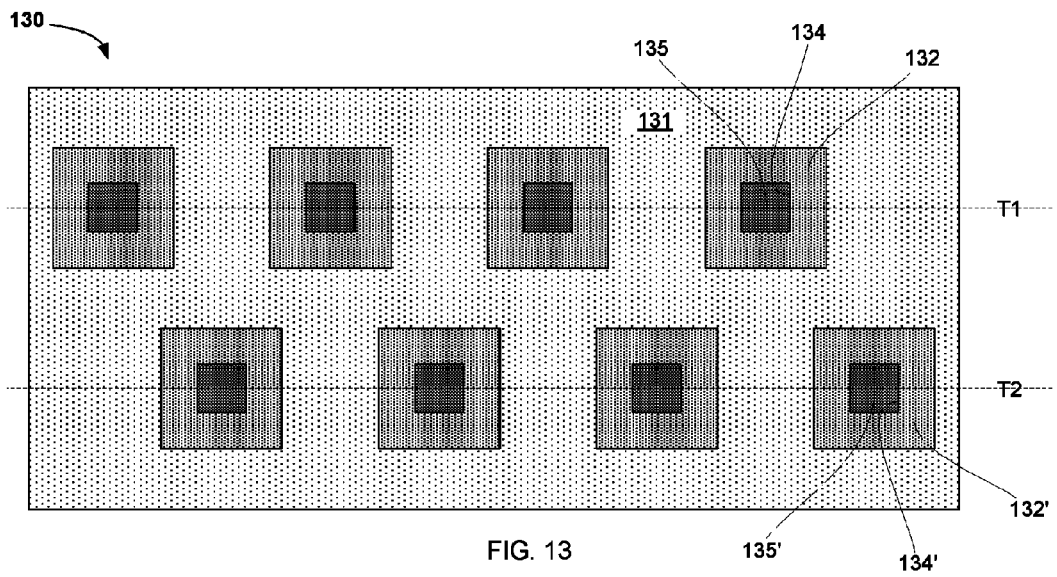
FIG. 13 is a diagrammatic sketch in plan view showing an IC test carrier according to another embodiment.

The receptacles may be mounted in other arrangements; and in some arrangements a greater number of receptacles may be mounted on a substrate having a given area. An example of apparatus having the receptacles and the openings arrayed in two staggered rows is illustrated in FIGS. 13, 14A. FIG. 13 shows in plan view a carrier 130 having a staggered array of receptacles 132, 132' mounted in two rows on a substrate 131, which includes test circuitry and devices associated therewith (not shown in the FIGs.), mounted on an upper surface thereof. Each receptacle in this example is provided with a cavity 134, 134' configured and dimensioned to receive a device to be tested, and in this example the floors 135, 135' of the cavities lie generally within a plane (an "x-y plane") parallel to the plane of the upper surface of the substrate. And, in this example, the rows of receptacles (and the cavities) are centered on two rows, indicated by broken lines T1 and T2, in FIG. 13.

FIG. 14A illustrates an example of a frame 140, configured for use with a carrier 130 configured and dimensioned as in FIG. 13. The frame 140 includes a plate 141 having pins 144, 144' projecting in a staggered array of two rows from a lower surface thereof; and openings 142, 142' through the plate 141. The openings 142, 142' define inner margins of the plate, and outer margins of the plate include a margin 146, 146' at the end of the plate. In this example the lower ends (not visible in the FIG.) of the pins are centered on a line (indicated by broken lines T1 and T2 in FIG. 14A).

Figure 14B:
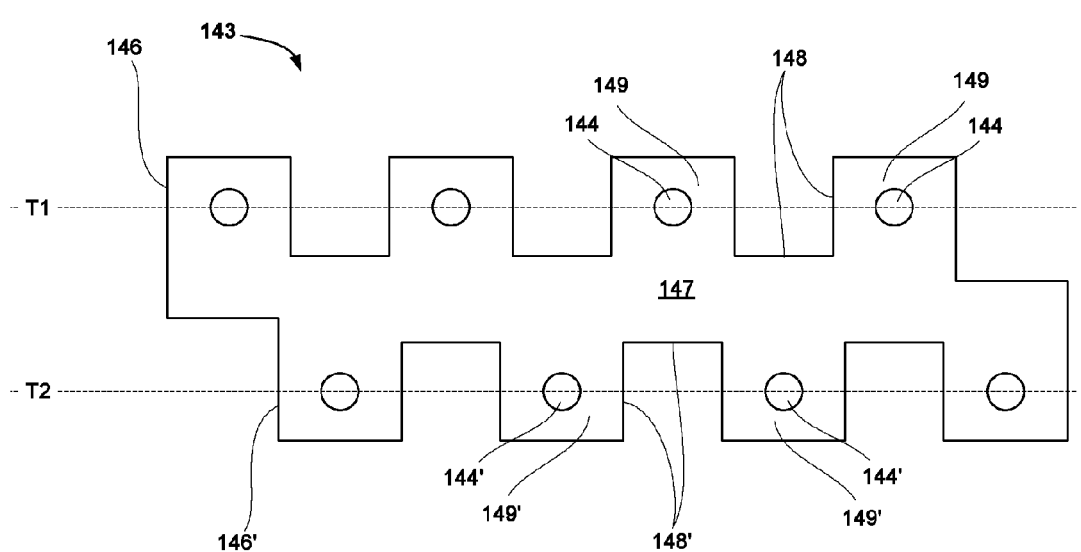
FIG. 14B is a diagrammatic sketch in a plan view showing an IC test frame according to another embodiment, suitable for deployment with a carrier as shown in FIG. 13.
Figure 15C:
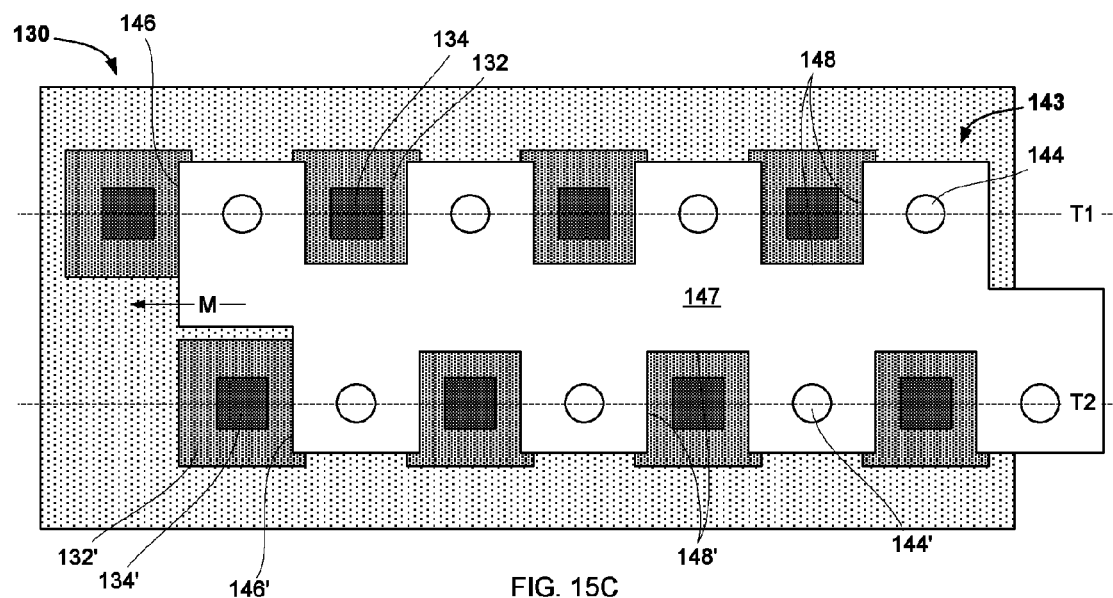
FIG. 15C is a diagrammatic sketch in a plan view showing a stage in deployment of an IC test manipulator including a carrier as shown in FIG. 13 and a frame as shown in FIG. 14B.
Figure 14A:
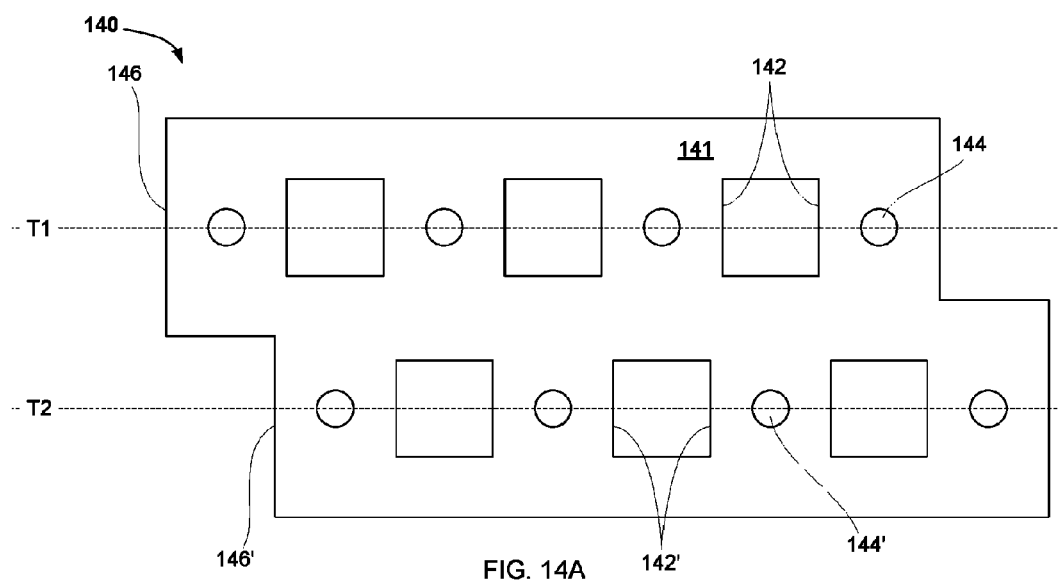
FIG. 14A is a diagrammatic sketch in plan view showing an IC test frame suitable for deployment together with a test carrier as shown in FIG. 13 according to another embodiment.
Figure 15A:
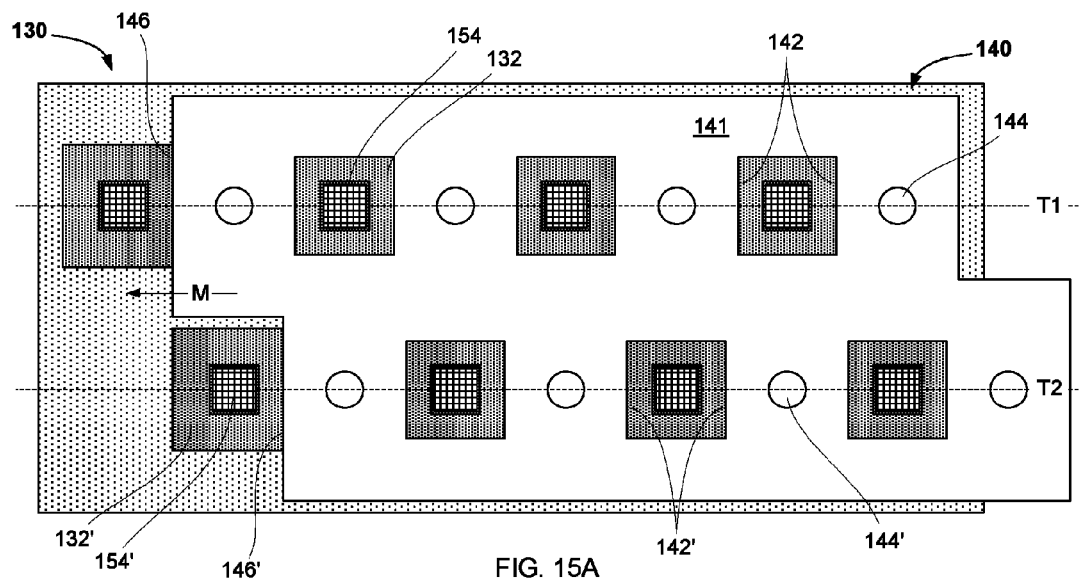
FIGS. 15A and 15B are diagrammatic sketches in plan views showing stages in deployment of an IC test manipulator including a carrier as shown in FIG. 13 and a frame as shown in FIG. 14A.
Figure 15B:
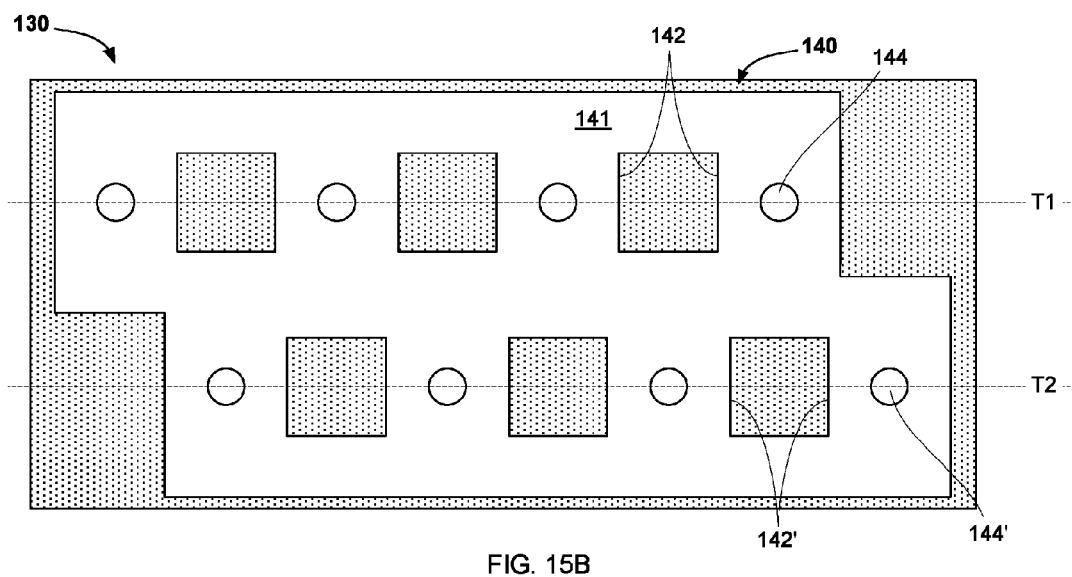

FIGS. 15A and 15B illustrate stages in deployment of a carrier and frame as in FIGS. 13, 14A in a device testing sequence. FIG. 15A illustrates the completion of a "load" stage and initiation of a first "shift" stage. Here, the devices 154, 154' to be tested were earlier loaded into the cavities in the array of receptacles 132, 132' by accessing them through the openings 142, 142' and beyond the outer margin 146, 146' of the plate 141. During the first "shift" stage the frame 140 is moved in relation to the carrier 130 in an x-y direction parallel to the center lines of the rows of pins, as suggested by the arrow M. Relative movement in the x-y direction continues until the ends of the pins 144, 144' are vertically aligned above the devices 154, 154' in the respective cavities, and then the x-y movement M is stopped, with a result as appears in plan view in FIG. 15B. FIG. 15B illustrates in plan view the completion of the first "shift" stage; in plan view the apparatus appears as in FIG. 15B through the "test" stage and on to initiation of the second "shift" stage.

In the foregoing examples of frames, access to some of the cavities for loading, and to some of the tested devices for removal, is by way of openings through the plate; and, in these examples, other cavities and tested devices are accessible outside the outer margin during the load and removal stages and are thereby accessible. In other embodiments the frame is configured such that all the cavities are accessible outside the outer margin of the plate. For instance, the plate may have a crenellated edge, configured so that the pins project from the solid portions, and the openings between the solid portions permit access to the cavities and tested devices. Examples of such crenellated frames, suitable for deployment with carriers configured as in FIGS. 9 and 13, are illustrated in FIGS. 10B and 14B, respectively.

Figure 10B:
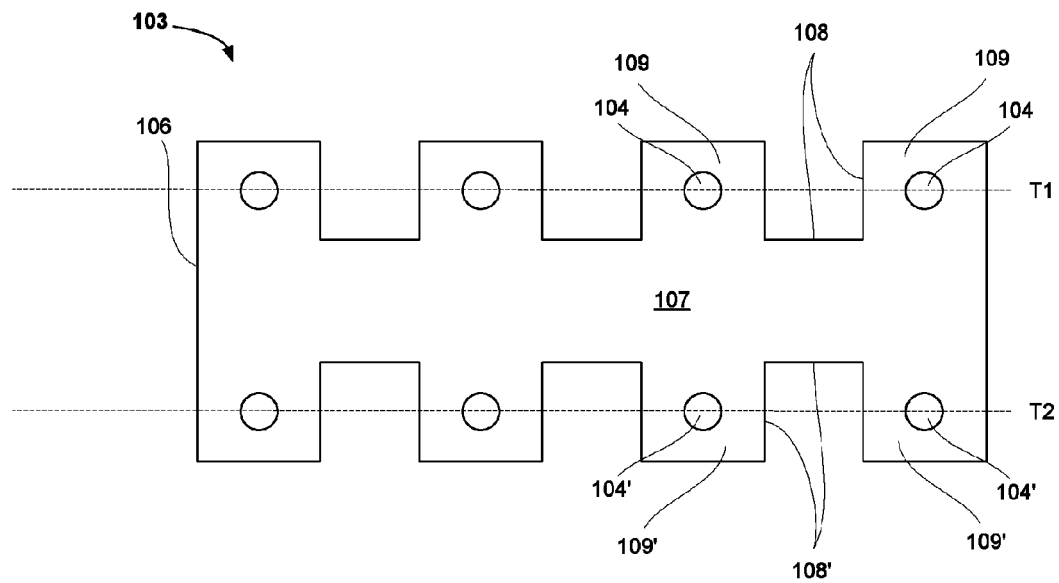
FIG. 10B is a diagrammatic sketch in a plan view showing an IC test frame according to another embodiment, suitable for deployment with a carrier as shown in FIG. 9.
Figure 11B:
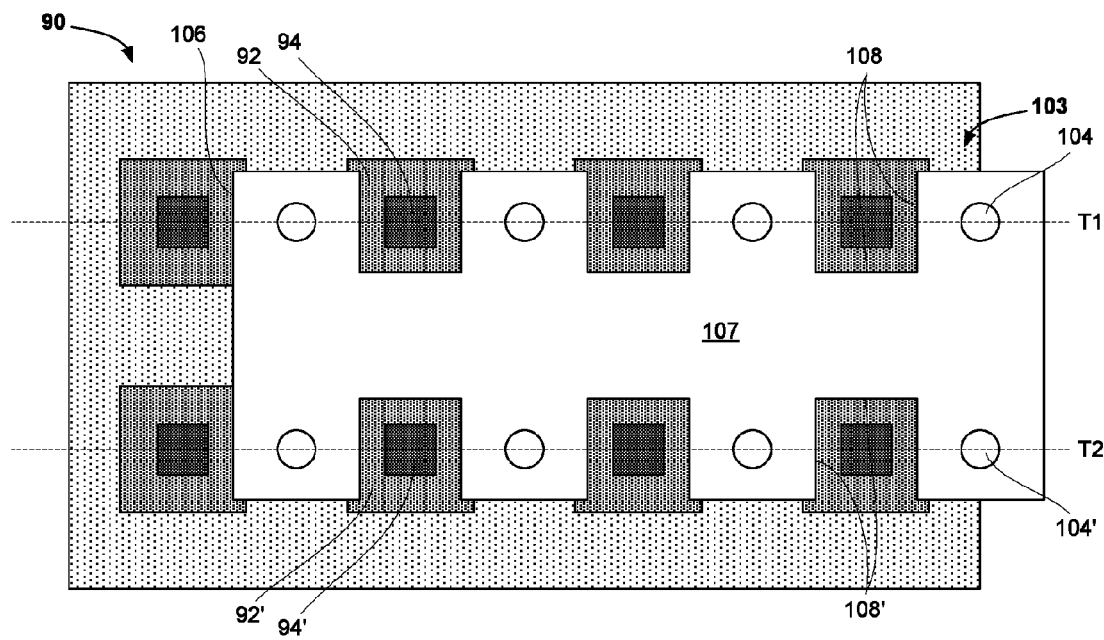
FIG. 11B is a diagrammatic sketch in a plan view showing a stage in deployment of an IC test manipulator including a carrier as shown in FIG. 9 and a frame as shown in FIG. 10B, according to another embodiment.

Referring to FIG. 10B (and to FIG. 10A for comparison), the plate 107 in this example includes solid portions 109, 109' from which the pins 104, 104' project, separated by openings 108, 108'. FIG. 11B shows alignment of a frame as in FIG. 10B with a carrier as in FIG. 9 prior to initiation of a "load" stage in deployment of the frame 103 with the carrier 90. As FIG. 11B illustrates, access to some of the cavities at the "load" stage (and to the tested devices at a later "removal" stage, not shown in the FIGs.) is by way of the openings 108, 108' along the sides of the plate, and other cavities (and tested devices) are accessed beyond the margin 106 at the end of the plate.

Referring to FIG. 14B (and to FIG. 14A for comparison), the plate 147 in this example includes solid portions 149, 149' from which the pins 144, 144' project, separated by openings 148, 148'. FIG. 15C shows alignment of a frame as in FIG. 14B with a carrier as in FIG. 13 prior to initiation of a "load" stage in deployment of the frame 143 with the carrier 130. As FIG. 15C illustrates, access to some of the cavities at the "load" stage (and to the tested devices at a later "removal" stage, not shown in the FIGs.) is by way of the openings 148, 148' along the sides of the plate, and other cavities (and tested devices) are accessed beyond the margin 146, 146' at the end of the plate.

As inspection of FIGS. 10A and 10B, and FIGS. 14A and 14B shows, increasing the open areas of the plate results in a reduction of the overall plate area. The overall plate area may be reduced still further (that is, the open areas may be increased), to the point that the plate amounts to narrow frame portions connecting the solid portions from which the pins project. In these FIGs. the solid portions are shown for simplicity as being rectangular; in practice the solid portions and connecting portions of the frame may have any shape so long as the frame provides structural support for the pins and for the mechanism by which it is held and moved during the test sequence.

Other arrangements of the cavities and receptacles on the carrier substrate are contemplated. The array may have more rows than shown in the FIGs., for example, and there may be more receptacles in each row. And the receptacles and cavities need not be arranged in an orderly array; whatever the arrangement, the frame will provide a corresponding arrangement of pins and open areas.

The density of cavities on the test carrier may be increased in a variety of ways. In one approach, each receptacle on the carrier substrate may be provided with two or more cavities; and the frame for use with the carrier may have clusters of pins arranged in a corresponding manner. By way of example, FIGS. 16A, 16B show a carrier having a row of four receptacles, each having four cavities in an orthogonal arrangement; and FIGS. 17A, 17B show a frame suitable for deployment with the carrier.

Figure 16A:
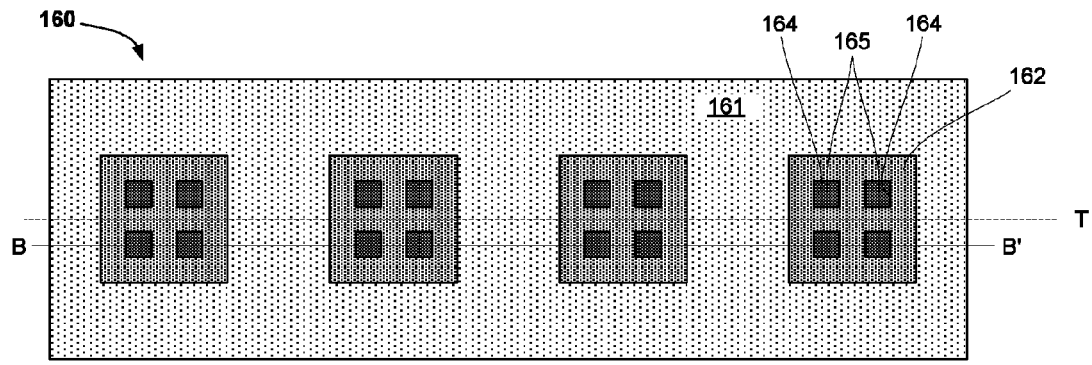
FIGS. 16A and 16B are diagrammatic sketches showing an IC test carrier according to an embodiment.
Figure 16B:
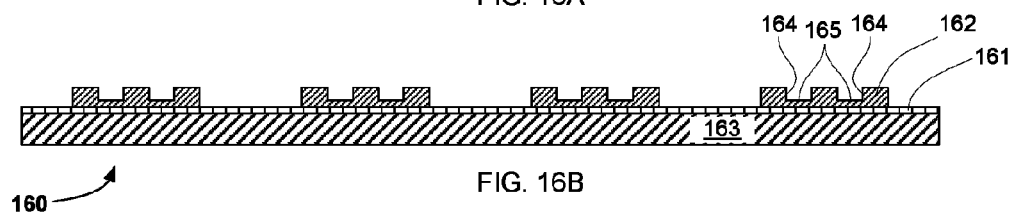

Turning to FIGS. 16A, 16B, carrier 160 includes a substrate 161 mounted on a support 163. The substrate 161 includes test circuitry, and devices associated therewith (not shown) mounted on an upper surface thereof. Receptacles 162 are mounted in an array (in this example, a row) on the surface of the circuit board 161. Each receptacle in this example is provided with a square array of four cavities 164 each configured and dimensioned to receive a device to be tested, and in this example the floors 165 of the cavities lie generally within a plane (an "x-y plane") parallel to the plane of the upper surface of the substrate. And, in this example, the receptacles (and the cavities) are centered on a line (indicated by broken line T in FIG. 16A).

Figure 17A:
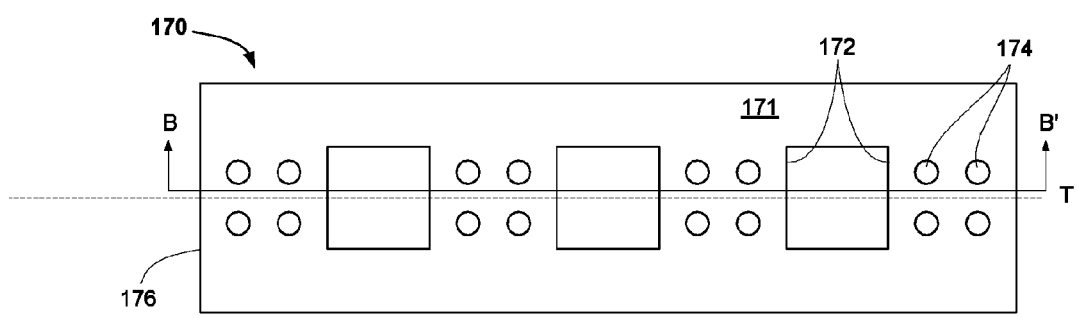
FIGS. 17A and 17B are diagrammatic sketches showing an IC test frame suitable for deployment together with a test carrier as shown in FIGS. 16A and 16B according to an embodiment.
Figure 17B:
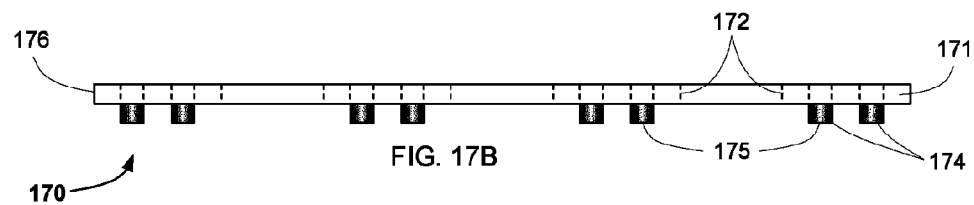

FIGS. 17A, 17B illustrate an example of a frame 170, configured for use with a carrier configured and dimensioned as in FIGS. 16A, 16B. The frame 170 includes a plate 171 having, in this example, a row of four clusters of four pins 174 each in a square array projecting from a lower surface thereof; and openings 172 through the plate 171. The openings 172 define inner margins of the plate, and outer margins of the plate include a margin 176 at the end of the plate. In this example the lower ends 175 of the pins lie generally within a plane (an "x-y plane") parallel to the plane of the lower surface of the plate. And, in this example, the clusters of pins are centered on a line (indicated by broken line T in FIG. 17A).

Figure 18A:
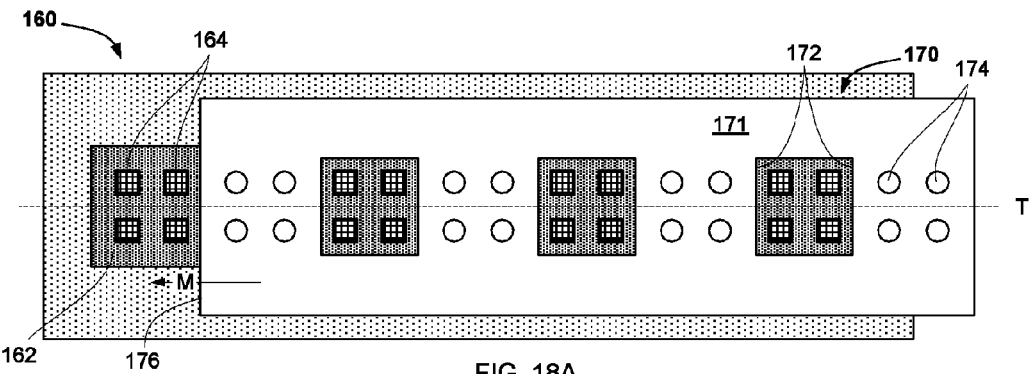
FIGS. 18A, 18B; and 19A, 19B are diagrammatic sketches showing stages in deployment of an IC test manipulator including a carrier as shown in FIGS. 16A, 16B and a frame as shown in FIGS. 17A, 17B.
Figure 18B:
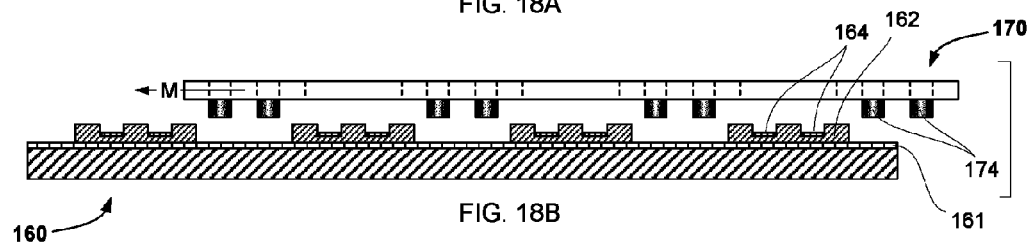
Figure 19A:
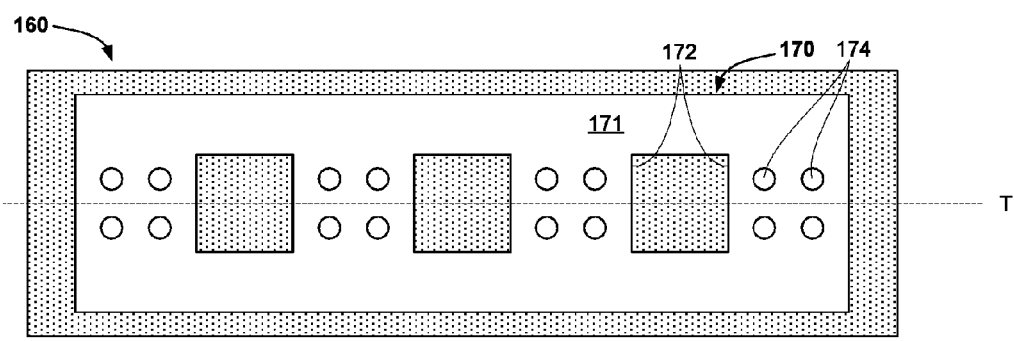
Figure 19B:
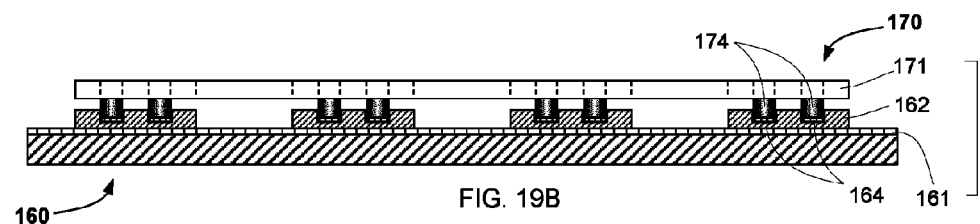

FIGS. 18A, 18B and 19A, 19B illustrate stages in deployment of a carrier and frame as in FIGS. 16A, 16B and 17A, 17B in a device testing sequence. FIGS. 18A, 18B illustrate the completion of a "load" stage and initiation of a first "shift" stage. Here, the devices 164 to be tested were earlier loaded into the cavities in the row of receptacles 162 by accessing them through the openings 172 and beyond the outer margin 176 of the plate 171. During the first "shift" stage the frame 170 is moved in relation to the carrier 160 in an x-y direction parallel to the center line of the row of receptacles, as suggested by the arrow M. Relative movement in the x-y direction continues until the ends of the pins 174 are vertically aligned above the devices 164 in the respective cavities, and then the x-y movement M is stopped, with a result as appears in FIGS. 19A, 19B. FIGS. 19A, 19B illustrate the completion of the first "shift" stage; the apparatus appears as in FIGS. 19A, 19B through the "compression" stage, the "test" stage and on to initiation of the "decompression" stage.

In the foregoing examples the carrier and frame are configured so that they are moved relative to one another along a straight line trajectory during the "shift" stages. Other trajectories are contemplated, including curved trajectories and, particularly, including trajectories that are circular or part-circular. For simplicity in the mechanism for handling the carrier and frame during the test sequence, the shift stages may be carried out by rotating the carrier and frame in relation to one another about a common axis.

Figure 20A:
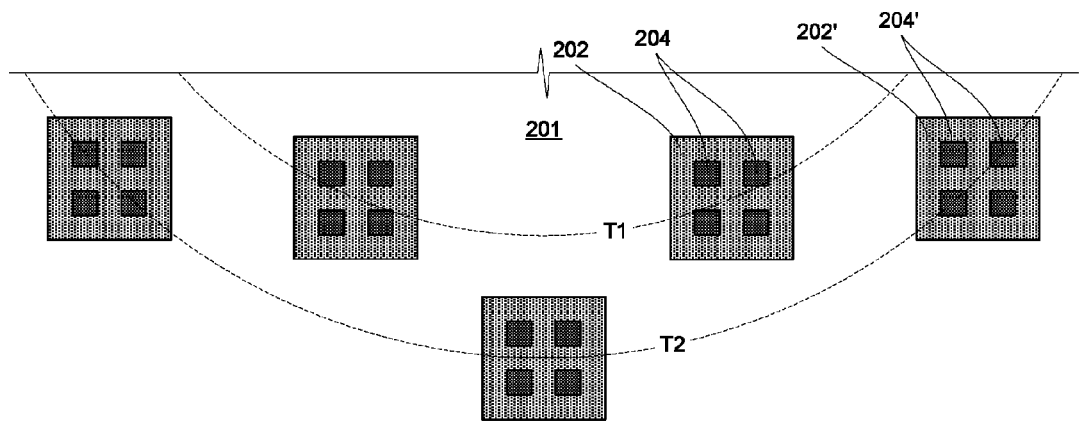
FIG. 20A is a diagrammatic sketch in a partial plan view showing an arrangement of IC test receptacles according to another embodiment.
Figure 20B:
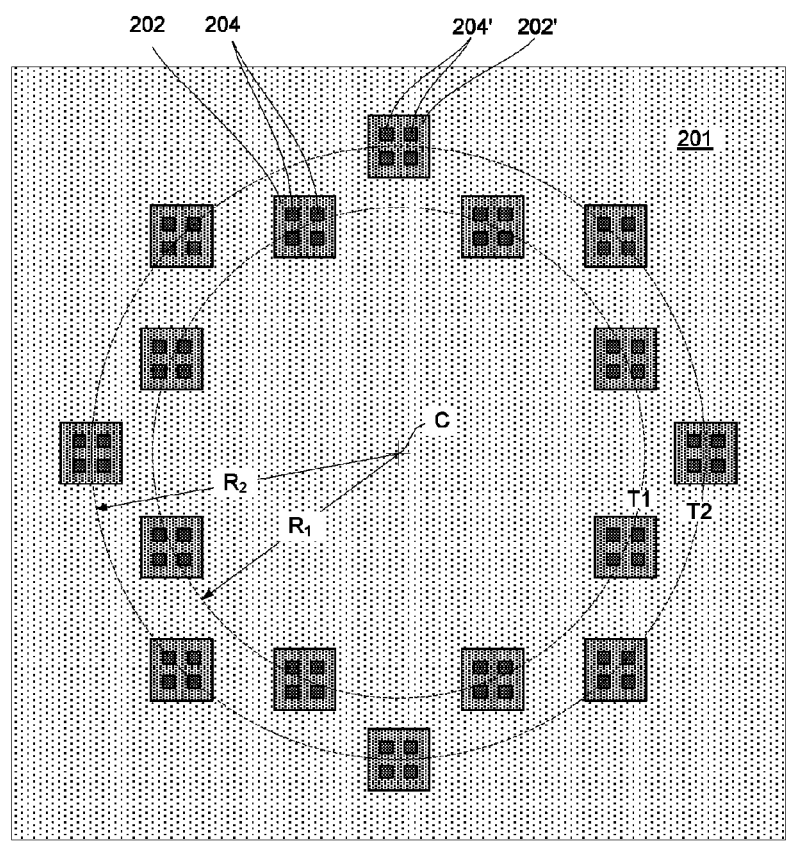
FIG. 20B is a diagrammatic sketch in a plan view showing an arrangement of IC test receptacles on an IC test carrier according to another embodiment.

FIG. 20A shows in plan view an example of an arrangement of receptacles on a test substrate 201 along two part-circular trajectories, indicated by curved broken lines T1 and T2. In this example certain of the receptacles (e.g., 202, each in this example having four cavities 204) are aligned on trajectory T1, and certain others of the receptacles (e.g., 202', each in this example having four cavities 204') are aligned on trajectory T2. As FIG. 20B shows, the trajectories are circular about a common center C: trajectory T1 has a radius R1 and trajectory T2 has a radius R2. A frame (not shown in the FIGs.) having a corresponding arrangement of clusters of pins and a plate having suitably formed openings or open areas may be deployed with a carrier as in FIG. 20B, by rotation about a coincident center.

Figure 21A:
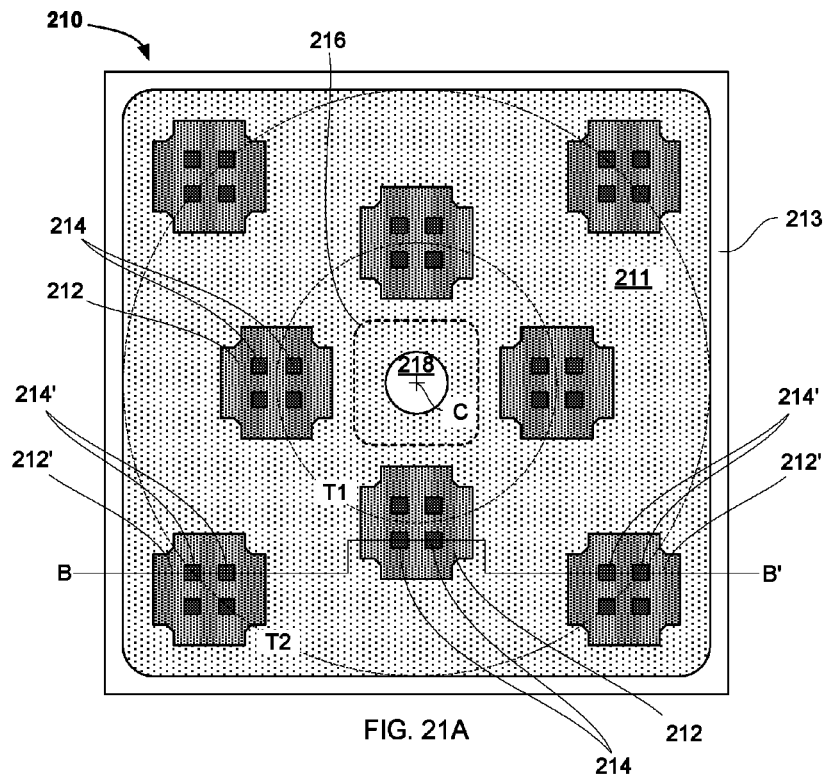
FIGS. 21A, 21B, 21C are diagrammatic sketches showing an IC test carrier according to another embodiment.
Figure 21B:
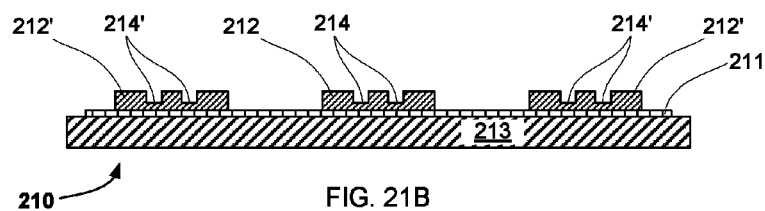
Figure 21C:
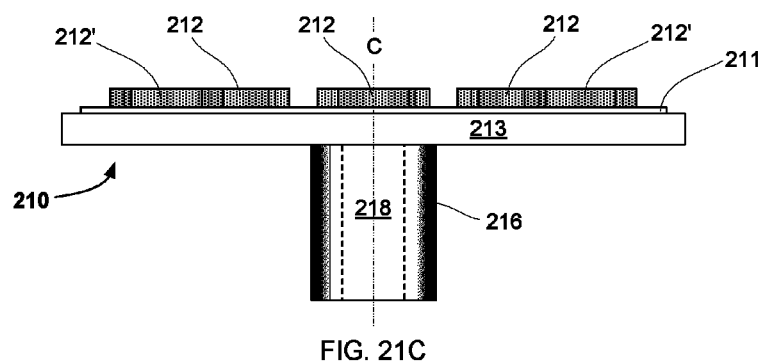
Figure 22A:
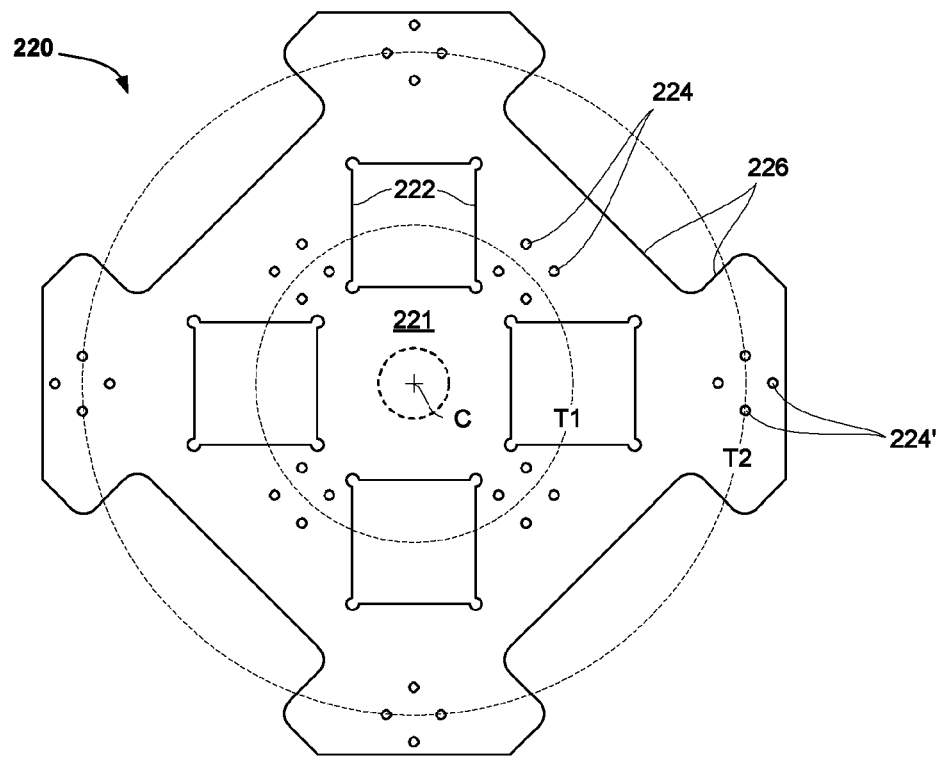
FIGS. 22A, 22B are diagrammatic sketches showing an IC test frame according to an embodiment, deployable with a carrier as shown in FIGS. 21A, 21B, 21C.
Figure 22B:
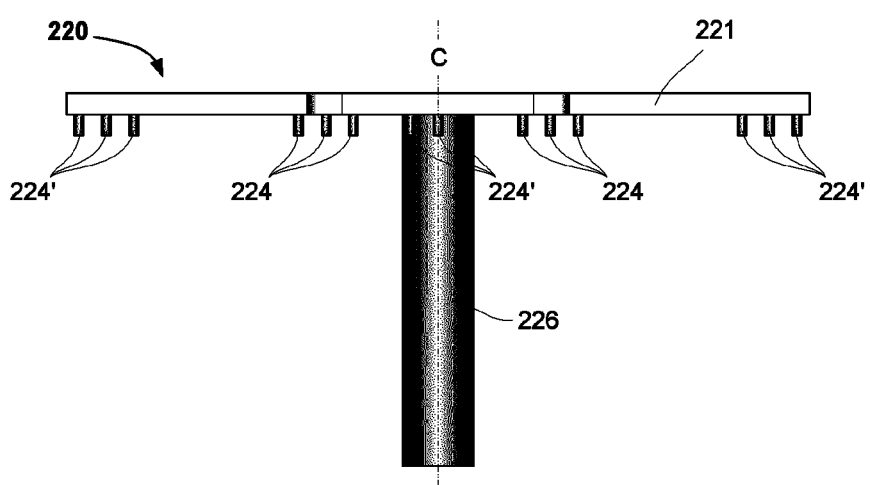

A particular example of such a rotation-based (carousel) apparatus is shown in FIGS. 21A, 21B, 21C (illustrating a carrier) and FIGS. 22A, 22B (illustrating a frame suitable for deployment with the carrier). The carrier 210 includes a substrate 211 mounted on a support 213. The substrate 211 includes test circuitry, and devices associated therewith (not shown) mounted on a first (upper) surface thereof. Receptacles are mounted on the surface of the circuit board 213 along two circular trajectories indicated by circular broken lines T1 and T2, which share a center C. Receptacles 212 are situated along an inboard trajectory T1, and receptacles 212' are situated along an outboard trajectory T2. Each receptacle 212, 212' in this example is provided with a square array of four cavities 214, 214' configured and dimensioned to receive a device to be tested, and in this example the floors of the cavities lie generally within a plane (an "x-y plane") parallel to the plane of the upper surface of the substrate. A stem 216 is affixed to the carrier support 213 on the (lower) support surface opposite the (upper) surface onto which the test substrate 211 and receptacles 212, 212' are mounted. The stem 216 has a cylindrical bore 218 therethrough; the axis of the bore is perpendicular to the surface of the substrate 211 and passes through the center C of the substrate.

The frame 220 includes a plate 221 having clusters of pins projecting from a (lower) surface thereof. The clusters are arranged along two circular trajectories indicated by circular broken lines T1 and T2, which share a center C. The arrangement of pins corresponds to the arrangement of cavities on the carrier 210, and each cluster of pins corresponds to the array of cavities on a receptacle (as described further below with reference to FIGS. 24A, 24B, 24C). Clusters of pins 224 are arranged along an inboard trajectory T1, and clusters of pins 224' are arranged along an outboard trajectory T2. The plate has openings 222 and open areas 226, at which the cavities can be accessed by a placement tool during a "load" stage of a test sequence, and the tested devices can be accessed during a "remove" stage" (as described further below with reference to FIGS. 23A, 23B). An axle 226 is affixed to the plate 221 on the (lower) surface from which the pins 224, 224' are mounted; the axis of the axle is perpendicular to the surface of the plate 221 and passes through the center C of the plate. The axle 266 is shaped and dimensioned to rotate and to slide upward and downward within cylindrical bore 218.

Figure 23A:
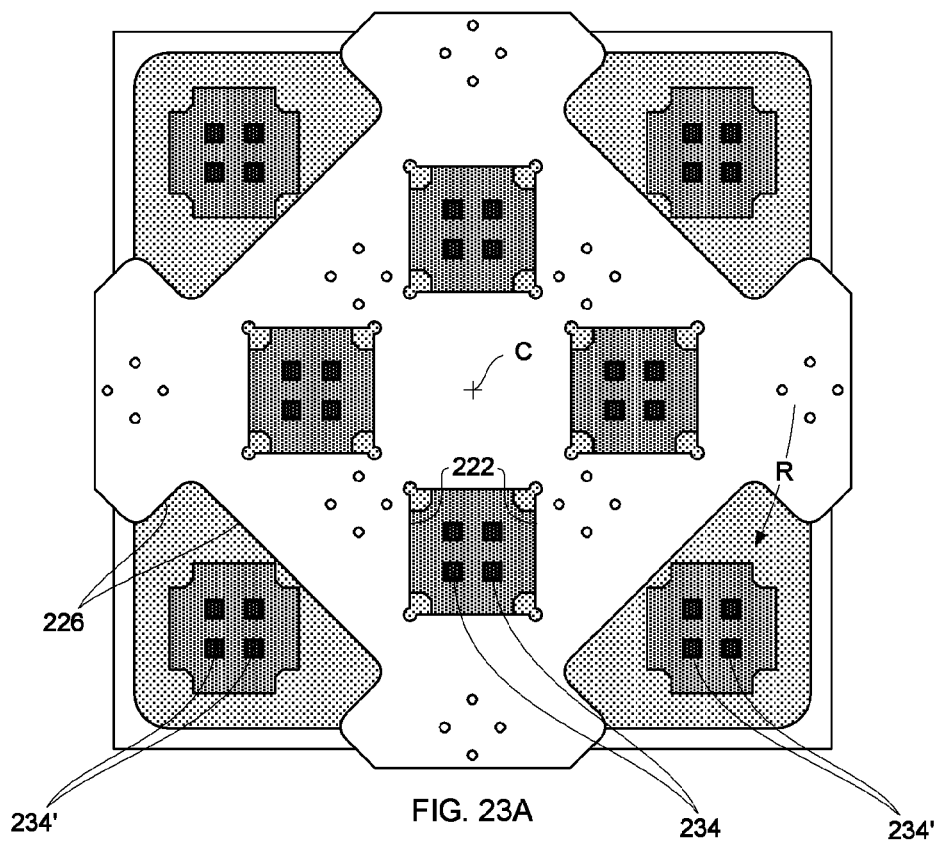
FIGS. 23A, 23B; and 24A, 24B, 24C are diagrammatic sketches showing stages in deployment of an IC test manipulator having a carrier as shown in FIGS. 21A, 21B and 21C and a frame as shown in FIGS. 22A and 22B.
Figure 23B:
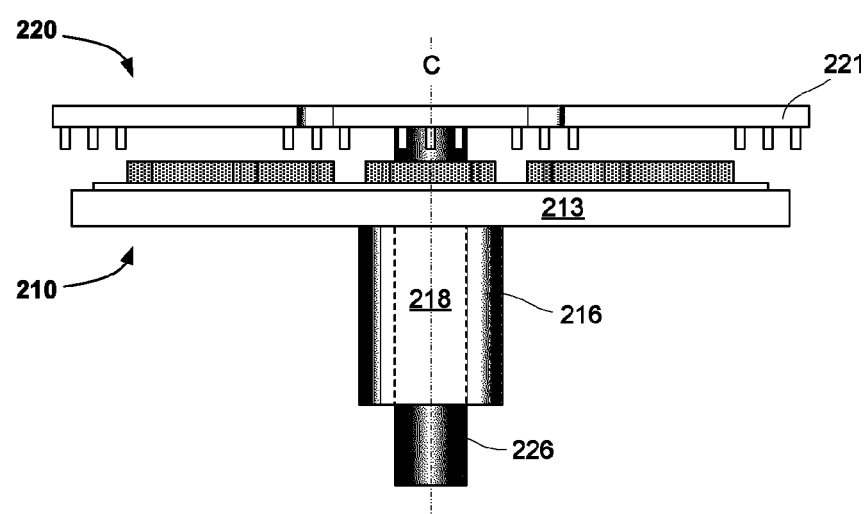
Figure 24A:
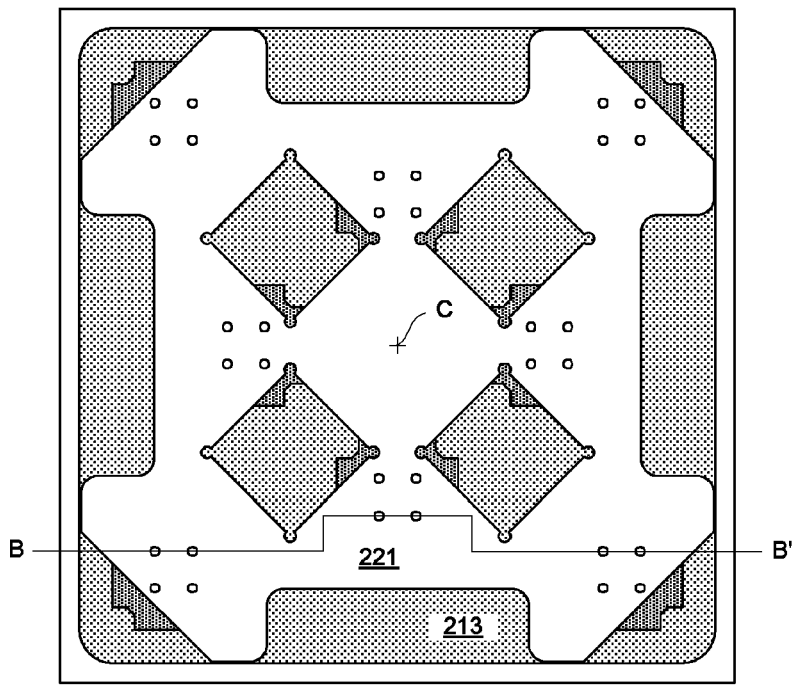
Figure 24B:
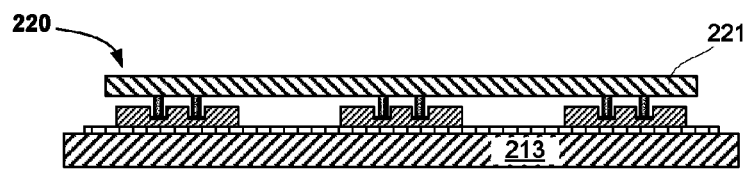
Figure 24C:
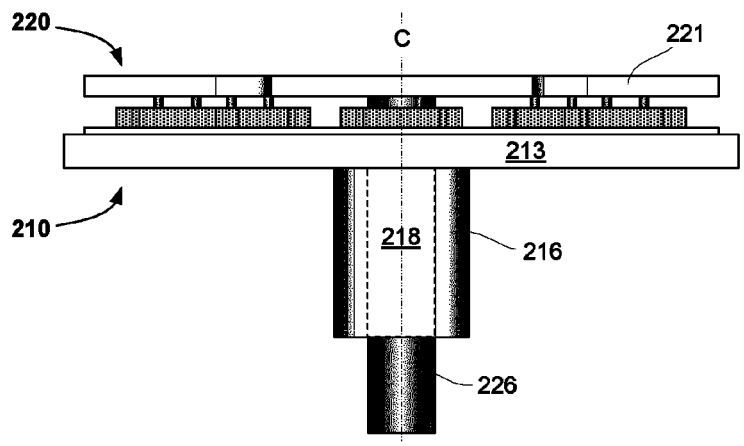

FIGS. 23A, 23B and 24A, 24B, 24C illustrate stages in deployment of a carrier and frame as in FIGS. 21A, 21B, 21C and 22A, 22B in a device testing sequence. As FIG. 23B particularly shows, the frame axle 226 is slidably (in the z direction) and rotatably inserted within the bore 218 of the carrier stem 216. FIGS. 23A, 23B illustrate the completion of a "load" stage and initiation of a first "shift" stage. Here, the devices 234, 234' to be tested were earlier loaded into the cavities 214, 214' in the receptacles 212, 212' by accessing them through the openings 222 and the open areas 226 of the plate 221. The frame is located along the z axis so that the plane of the pin tips can pass over the receptacles without interference when the frame is rotated relative to the carrier. During the first "shift" stage the frame 220 is rotated about the center C relative to the carrier 210 in an x-y plane and perpendicular to the axis of the axle 226, as suggested by the arrow R. Relative rotational movement continues until the ends of the pins 224, 224' are vertically aligned above the devices 234, 234' in the respective cavities, and then the rotational movement R is stopped. The frame is then moved downward (along the center axis) in a "compression" stage. The downward movement of the frame brings the pins 224, 224' downward into the cavities, and eventually brings the pin ends in contact with the devices 234, 234', as illustrated in FIGS. 24A, 24B, 24C. The downward movement continues until the pins compress the devices against the floors of the cavities with a force sufficient to establish a secure (temporary) electrical continuity between the devices and electrical contacts in the cavities, but not so great as to damage the devices.

The stage illustrated in FIGS. 24A, 24B, 24C, in which the devices are clamped in place in the cavities at the completion of the "compression" stage, may be referred to as a "test" stage. In this stage, the test circuitry is employed to test the electrical functionality of the device (or at least of selected components of the device).

Where the device is or includes position or motion or acceleration sensing functionality, this functionality may be tested by tilting or moving the assembly. The tilting or moving mechanism may conveniently be connected to the stem 216.

Following completion of the testing the frame is moved upward in relation to the carrier (that is in a z direction). The upward movement of the frame brings the pins 224, 224' upward away from the devices 234, 234' in the floors of the cavities 214, 214' in the receptacles 212, 212', and this upward movement stage may be referred to as a "decompression" stage.

Eventually the upward movement of the frame brings the pin ends to a level above the receptacles, so that the frame and pins can again be rotated without interference between the pins and the receptacles. There follows a second "shift" stage, in which the frame 220 is again rotated in relation to the carrier 210. Relative rotation continues until the devices 234, 234' in the cavities are exposed through the openings 222 in the plate and the open portions at the plate margin 226 of the plate, and then the rotation is stopped. The direction of rotation in the second shift stage may be the same as or opposite the direction in the first shift stage.

The completion of the second "shift" stage may be referred to as a "removal" stage, as the exposed devices 234, 234' are now available for removal from the cavities. Typically, the devices are removed using automated equipment (not shown in the FIGs.), such as a conventional "pick-and-place" tool; and the tool may be the same tool as used in the "load" stage. Accordingly, the openings 222 in the plate and the open portions at the plate margin 226 of the plate are shaped and dimensioned to accommodate the device and the tool during placement.

Devices that failed the test criteria during the test stage are separated by the removal tool from devices that satisfied the test specifications; and the devices that passed the test are sent along for further processing.

Once the tested devices have been removed from the cavities, the apparatus is again ready to receive untested devices for testing, and a new testing sequence may be carried out, starting with a "load" stage.

Typically, the carrier and the frame will be held, positioned, and moved using automated machinery (not shown in the FIGs.). As may be appreciated, relative movement of the frame and the carrier may be accomplished by holding the carrier immobile and moving the frame, or by holding the frame immobile and moving the carrier, or by moving both the frame and the carrier. Where testing of motion or position or acceleration functionality is required, the entire assembly may be moved or tilted using the automated machinery as the electronic testing is carried out.

Figure 25:
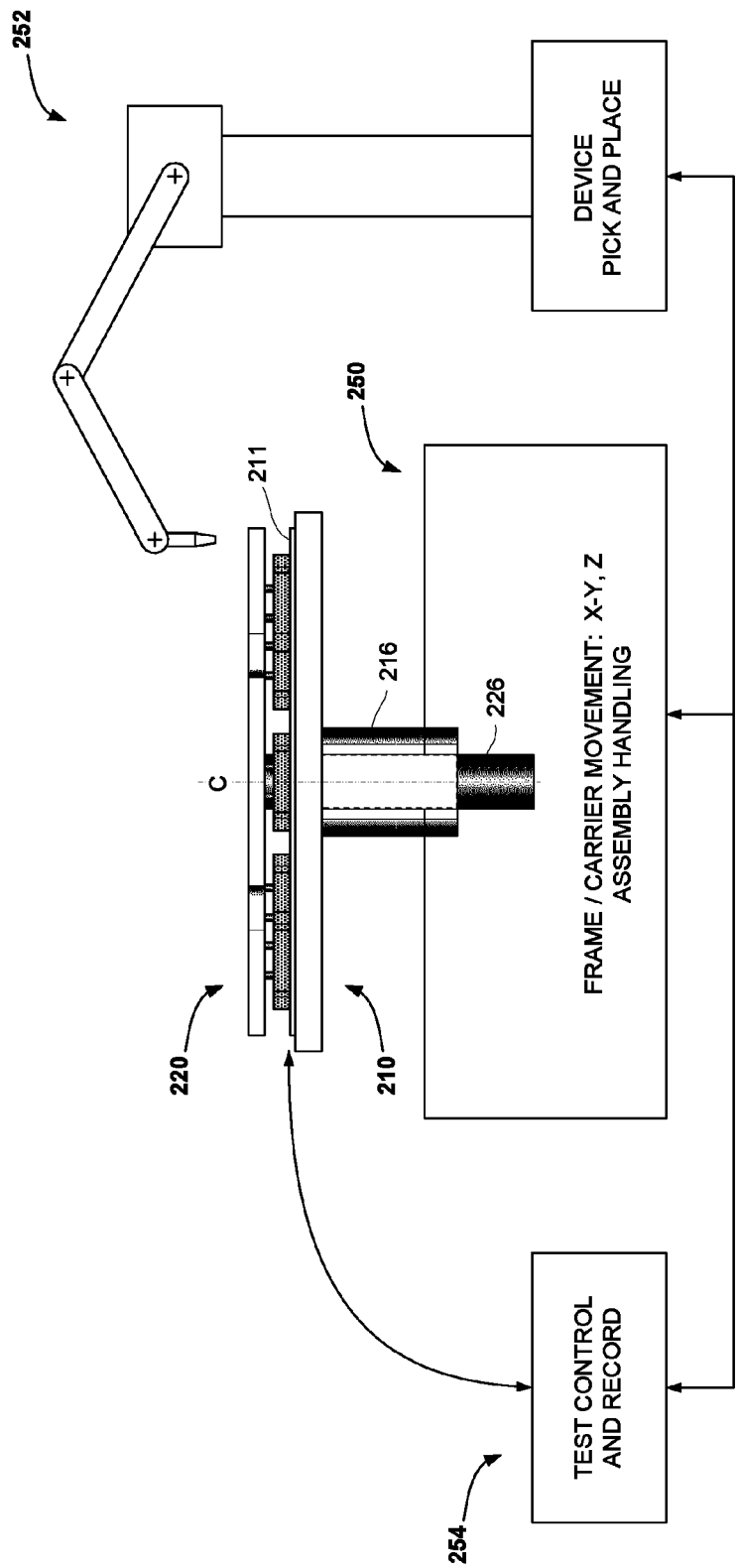
FIG. 25 is a diagrammatic sketch showing, partly symbolically, a test system including rotation-based (carousel-type) test apparatus, in which the inertial sensing functionality of MEMS inertial sensing devices can be carried out.

FIG. 25 shows an example of a system for manipulating a carousel-type test apparatus, for loading and unloading devices for testing and following test, and for carrying out a test program. The frame 220 and carrier 210 are shown assembled and positioned in a "test" stage (refer to FIGS. 24A, 24B, 24C and related text for detailed description). The test apparatus is held and manipulated by automated machinery, indicated symbolically at 250. The automated machinery 250 is configured to move the frame and carrier relative to one another in the x-y plane for the "load", "shift" and "unload" stages; and in a z direction for the "compress", and "decompress" stages, described above. Additionally the automated machinery 250 is configured to move the apparatus (frame and carrier) together as a unit while it is in the "test" stage, to perturb the inertial sensors in the devices being tested. Automated pick and place machinery 252 is configured to place devices to be tested in the cavities on the carrier during a "load" procedure and to remove tested devices during an "unload" procedure, and to "bin" tested devices. As noted above, the carrier includes test circuitry in a substrate 211 mounted onto the support. Some testing functionality may be situated on board the carrier; portions of the testing functionality that are not on board the carrier can be provided in test control and record apparatus 254, connected to the onboard circuitry. The apparatus 254 may be or include a computer having processor and memory capability, and may include operator interface devices and display devices, for example. The apparatus 254 may be operatively connected to the automated machinery 250 and to the pick and place apparatus 252, and the automated machinery 250 may be operatively connected to the pick and place apparatus 252, so that the actions of the various components of the system can be coordinated throughout the test sequence, as will be apparent. For example, the pick and place apparatus 252 can communicate with the automated machinery 250 through the operative connection between them, to initiate a device load (or unload) by the pick and place apparatus when the automated machinery indicates that the apparatus is in a "load" (or "unload") stage. And, for example, the automated machinery 250 can communicate with the test control and record apparatus 254 through the operative connection between them, to initiate a test program when the automated machinery indicates that the frame and carrier are in a "test" position, loaded with devices to be tested; and to initiate a "decompress" stage when the test and record apparatus indicates that the test program has been completed. And, for example, the test control and record apparatus 254 can communicate with the pick and place apparatus 252 through the operative connection between them, to indicate to the pick and place apparatus the addresses of the devices that met the test specifications, so that the pick and place apparatus can appropriately bin the tested devices (separating "good" from "bad" devices). The components described with reference to FIG. 25 are coupled by a control system, such as a computer or computer network configured to execute a control program. The computer may be separate from the identified components, or part of one or more of them. The control program constitutes logic to perform a test sequence as described herein.

Figure 26:
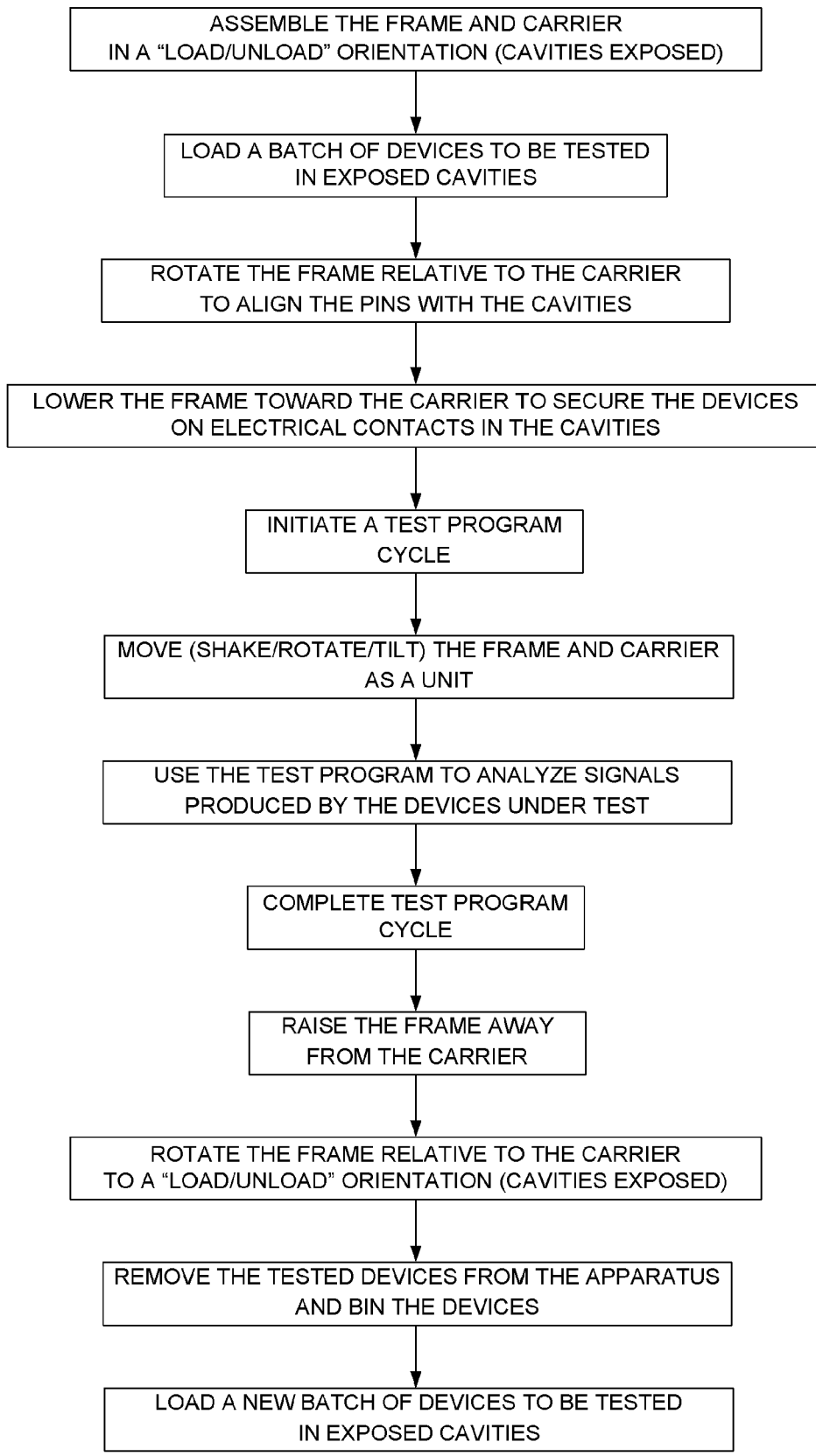
FIG. 26 is a flow diagram outlining steps in a MEMS inertial sensing device testing sequence employing rotation-based (carousel-type) test apparatus.

FIG. 26 outlines steps in test sequence using a carousel-type testing apparatus in a system as outlined with reference to FIG. 25, and executed by a control system for such apparatus.

Other embodiments are within the claims.

We claim:

1. IC device testing apparatus comprising:
a frame and a carrier configured to be movable relative one another in an x-y plane and in a z direction, said carrier comprising receptacles mounted on a test substrate, each said receptacle having one or more cavities into which devices to be tested can be received; said frame comprising pins mounted to and projecting from a surface of a plate, said plate having open areas; wherein said pins are arranged in a manner complementary to an arrangement of said cavities, and said open areas are arranged in a manner complementary to the arrangement of said cavities.

2. The apparatus of claim 1 wherein each receptacle includes one cavity.

3. The apparatus of claim 1 wherein each receptacle includes a plurality of cavities.

4. The apparatus of claim 1 wherein said cavities are blind, so that devices placed in the cavities rest on test contacts in a cavity floor.

5. The apparatus of claim 1 wherein said cavities pass through the receptacles, so that the devices rest upon test contacts on the test substrate itself.

6. The apparatus of claim 1 wherein said open areas are formed as openings through the plate.

7. The apparatus of claim 1 wherein said open areas are formed at the plate margin.

8. The apparatus of claim 1 wherein said open areas include both openings through the plate and open areas at the plate margin.

9. Apparatus of claim 1 wherein said frame and said carrier are configured to be moveable relative to one another in an x-y plane along a straight trajectory.

10. Apparatus of claim 1 wherein said frame and said carrier are configured to be moveable relative to one another in an x-y plane along a curved trajectory.

11. Apparatus of claim 1 wherein said frame and said carrier are configured to be moveable relative to one another in an x-y plane along a circular trajectory.

12. Apparatus of claim 1 wherein said frame and said carrier are configured to be rotatable relative to one another in an x-y plane about a common center.

13. Apparatus of claim 12 wherein said test substrate is mounted on a first surface of a support, said test substrate and said support having an opening therethrough at said center; further comprising a stem mounted on a second side of said support, said stem having a cylindrical bore therethrough defining a rotational axis passing through said center perpendicular to said x-y plane; and wherein said frame has an axle mounted on said plate surface, having an axis passing through said center perpendicular to said x-y plane, said axle being dimensioned to move slidably and rotatably within said bore.

14. A system for IC device testing, comprising test apparatus as recited in claim 1, device placement and removal apparatus, frame and carrier handling apparatus, and test control and record apparatus operatively connected to test circuitry in the test substrate; wherein the frame and carrier handling apparatus, the device placement and removal apparatus, and the test control and record apparatus are operatively connected.

15. The system of claim 14, including a control system coupled to the frame and carrier handling apparatus, the device placement and removal apparatus, and the test control and record apparatus, including logic executable perform a process including:
orienting the frame and carrier so that the open areas of the plate expose a plurality of cavities on the carrier;
loading IC devices to be tested in the exposed cavities;
moving the frame relative to the carrier to align the pins with the cavities;
moving the frame toward the carrier so that the pins secure the devices within the cavities and provide electrical contact of the devices to test circuitry;
initiating a device test program;
completing the test program;
moving the frame away from the carrier and moving the frame relative to the carrier to expose the cavities; and
removing the IC devices from the cavities and binning the devices.

16. The system of claim 14, including a control system coupled to the frame and carrier handling apparatus, the device placement and removal apparatus, and the test control and record apparatus, including logic executable perform a process including:
orienting the frame and carrier so that the open areas of the plate expose a plurality of cavities on the carrier;
loading IC devices to be tested in the exposed cavities;
moving the frame relative to the carrier to align the pins with the cavities;
moving the frame toward the carrier so that the pins secure the devices within the cavities and provide electrical contact of the devices to test circuitry;
initiating a device test program;
moving the frame and carrier as a unit to perturb sensors on the devices;
completing the test program;
moving the frame away from the carrier and moving the frame relative to the carrier to expose the cavities; and
removing the IC devices from the cavities and binning the devices.

17. A method for testing IC devices, comprising:
providing test apparatus as recited in claim 1;
orienting the frame and carrier so that the open areas of the plate expose a plurality of cavities on the carrier;
loading IC devices to be tested in the exposed cavities;
moving the frame relative to the carrier to align the pins with the cavities;
moving the frame toward the carrier so that the pins secure the devices within the cavities and provide electrical contact of the devices to test circuitry;
initiating a device test program;
completing the test program;
moving the frame away from the carrier and moving the frame relative to the carrier to expose the cavities; and
removing the IC devices from the cavities and binning the devices.

18. A method for testing IC devices having an inertial sensing functionality, comprising:
providing test apparatus as recited in claim 1;
orienting the frame and carrier so that the open areas of the plate expose a plurality of cavities on the carrier;
loading IC devices to be tested in the exposed cavities;
moving the frame relative to the carrier to align the pins with the cavities;
moving the frame toward the carrier so that the pins secure the devices within the cavities and provide electrical contact of the devices to test circuitry;
initiating a device test program;
moving the frame and carrier as a unit to perturb sensors on the devices;
completing the test program;
moving the frame away from the carrier and moving the frame relative to the carrier to expose the cavities; and
removing the IC devices from the cavities and binning the devices.

* * * * *